United States Patent
Nishii et al.

(10) Patent No.: US 9,270,252 B2
(45) Date of Patent: Feb. 23, 2016

(54) ACOUSTIC WAVE DEVICE AND METHOD FOR MANUFACTURING SAME

(75) Inventors: Junya Nishii, Kyoto (JP); Tsuyoshi Nakai, Kyoto (JP); Kazuhiro Otsuka, Shiga (JP)

(73) Assignee: KYOCERA Corporation, Kyoto (JP)

( * ) Notice: Subject to any disclaimer, the term of this patent is extended or adjusted under 35 U.S.C. 154(b) by 949 days.

(21) Appl. No.: 13/265,527

(22) PCT Filed: Mar. 19, 2010

(86) PCT No.: PCT/JP2010/054814
§ 371 (c)(1),
(2), (4) Date: Oct. 20, 2011

(87) PCT Pub. No.: WO2010/125873
PCT Pub. Date: Nov. 4, 2010

(65) Prior Publication Data
US 2012/0032759 A1 Feb. 9, 2012

(30) Foreign Application Priority Data

Apr. 28, 2009 (JP) ................................. 2009-108691
Jul. 30, 2009 (JP) ................................. 2009-178414

(51) Int. Cl.
H03H 9/25 (2006.01)
H03H 3/08 (2006.01)
H03H 9/10 (2006.01)
H03H 9/64 (2006.01)

(52) U.S. Cl.
CPC ............... *H03H 9/1071* (2013.01); *H03H 3/08* (2013.01); *H03H 9/6433* (2013.01)

(58) Field of Classification Search
CPC ........... H03H 9/00; H03H 9/10; H03H 9/059; H01L 41/053
USPC ........................ 333/193–196, 133; 310/313 R
See application file for complete search history.

(56) References Cited

U.S. PATENT DOCUMENTS

| | | | |
|---|---|---|---|
| 6,710,682 B2 * | 3/2004 | Onishi et al. ................... 333/193 |
| 7,459,829 B2 * | 12/2008 | Aoki et al. ................. 310/313 B |
| 8,154,170 B2 | 4/2012 | Kimura et al. |
| 8,810,111 B2 * | 8/2014 | Fukano et al. ................ 310/348 |
| 8,963,655 B2 * | 2/2015 | Ookubo ........................ 333/193 |
| 8,975,803 B2 * | 3/2015 | Fukano et al. ............. 310/313 R |
| 2006/0192462 A1 * | 8/2006 | Iwamoto et al. ............... 310/348 |
| 2009/0201102 A1 * | 8/2009 | Oda ................................. 333/193 |
| 2010/0052473 A1 * | 3/2010 | Kimura et al. ............. 310/313 R |
| 2011/0018389 A1 * | 1/2011 | Fukano et al. ............. 310/313 R |
| 2011/0234055 A1 * | 9/2011 | Fukano et al. ................ 310/365 |

FOREIGN PATENT DOCUMENTS

JP 2001-185976 7/2001
JP 2004-274574 9/2004
(Continued)

*Primary Examiner* — Dean Takaoka
(74) *Attorney, Agent, or Firm* — Procopio, Cory, Hargreaves & Savitch LLP

(57) ABSTRACT

A SAW device (1) has a substrate (3) configured to propagate acoustic waves; an IDT electrode (15) on a first main surface (3*a*) of a substrate (3); and an electrode pad (13) on the first main surface (3*a*) electrically connected to the IDT electrode (15). The SAW device (1) also has a terminal with a pillar-shape (column part (7*z*)) setted up on the electrode pad (13); a third conductive layer (39) extending from a side surface of the column part (7*z*); and a cover (5) forming a vibration space (S) above the IDT electrode (15) and covering the side surface of the column part (7*z*), and the third conductive layer (39).

16 Claims, 19 Drawing Sheets

(56) References Cited

FOREIGN PATENT DOCUMENTS

| JP | 2005-252335 | 9/2005 | |
| JP | 2008-124786 | 5/2006 | |
| JP | 2007-208665 | 8/2007 | |
| JP | 2007-259430 | 10/2007 | |
| JP | 2008153957 A | 7/2008 | |
| JP | 2010056671 A | 3/2010 | |
| WO | WO 2008059674 A1 * | 5/2008 | ............. H01L 41/22 |

* cited by examiner

ACOUSTIC WAVE DEVICE AND METHOD FOR MANUFACTURING SAME

CROSS-REFERENCE TO THE RELATED APPLICATIONS

This application is a national stage of international application No. PCT/JP20101054814, filed on Mar. 19, 2010, and claims the benefit of priority under 35 USC 119 of Japanese Patent Application No. 2009-108691, filed on Apr. 28, 2009 and Japanese Patent Application No. 2009-178414, filed on Jul. 30, 2009, the entire contents of all of which are incorporated herein by reference.

TECHNICAL FIELD

The present invention relates to an acoustic wave (elastic wave) device such as a surface acoustic wave (SAW) device, a film bulk acoustic resonator (FEAR), or the like and a method for manufacturing the same.

BACKGROUND ART

An acoustic wave device of a so-called wafer level package aimed at reduction of size etc. is known.

As an acoustic wave device of a wafer level package, for example, Patent Literature 1 discloses one wherein an acoustic wave element arranged on a main surface of a piezoelectric substrate is accommodated in a cavity arranged in a first sealing part.

The acoustic wave device of Patent Literature 1 is provided with electrode pads arranged on the main surface of the piezoelectric substrate. On each electrode pad, a columnar terminal part is formed. The terminal part is exposed from the top surface of a second sealing part covering the first sealing part.

The art of Patent Literature 1 has the drawback that if peeling occurs between a terminal part and the second sealing part due to a difference in heat expansion between the second sealing part and the terminal parts, moisture invading a clearance formed due to the peeling reaches the main surface and a connection portion of the terminal part and the electrode pad becomes corroded.

Accordingly, preferably an acoustic wave device capable of suppressing occurrence of corrosion of a connection portion of a terminal and an electrode pad and a method for manufacturing the same are provided.

PRIOR ART LITERATURE

Patent Literature

PATENT LITERATURE 1: Japanese Patent Publication No. 2007-208665

SUMMARY OF THE INVENTION

An acoustic wave device according to a first aspect of the present invention has a substrate which allows propagation of acoustic waves; an excitation electrode which is arranged on a main surface of the substrate; an electrode pad which is electrically connected to the excitation electrode and is arranged on the main surface; a terminal with a pillar-shape which is arranged on the electrode pad; a conductive projection extending from side surface of the terminal; and a cover which is arranged above the main surface of the substrate and covers the side surface of the terminal and the projection and protects the excitation electrode.

A method for manufacturing an acoustic wave device according to a second aspect of the present invention has a step of forming, on a main surface of a substrate, an excitation electrode and electrode pad which is connected to the excitation electrode; a step of forming a frame part which is stacked over the main surface, is formed in a frame shape surrounding the excitation electrode in a plan view of the main surface, and has first through hole formed therein that exposes the electrode pad; a step of forming a plating foundation layer in the inside of the first through hole and on the top surface of the frame part; a step of forming a resist layer on the plating foundation layer which exposes the plating foundation layer in the first through hole and on portion of the top surface of the frame part at a pattern connected to the first through hole; a step of depositing metal on the plating foundation layer exposed from the resist layer by plating; a step of removing the resist layer and a portion of the plating foundation layer which is covered by the resist layer; a step of forming a lid part which is stacked on the frame part, is formed in a lid shape closing opening of the frame part, and is formed with second through hole that exposes the deposited metal in the first through hole; and a step of filling metal in the second through hole.

A method for manufacturing an acoustic wave device according to a third aspect of the present invention has a step of forming, on a main surface of a substrate, an excitation electrode and an electrode pad which is connected to the excitation electrode; a step of forming a frame part which is stacked over the main surface, is formed in a frame shape surrounding the excitation electrode in a plan view of the main surface, and has a first through hole formed therein that exposes the electrode pad; a step of forming a conductive foundation layer in the inside of the first through hole and on the top surface of the frame part at a region of a pattern connected to the first through hole; a step of forming a lid part which is stacked on the frame part, is formed in a lid shape closing opening of the frame part, and is formed with second through hole that exposes the first through hole; and a step of filling metal in the inside of the first through hole and the second through hole.

A method for manufacturing an acoustic wave device according to a fourth aspect of the present invention has a step of forming, on a main surface of a substrate, an excitation electrode and an electrode pad which is connected to the excitation electrode; a step of forming a frame part which is stacked over the main surface, is formed in frame shape surrounding the excitation electrode in a plan view of the main surface, and has a first through hole formed therein that exposes the electrode pad; a step of forming a lid part which is stacked on the frame part, is formed in a lid shape closing opening of the frame part, is formed with second through hole that exposes the first through hole; a step of forming a plating foundation layer in the insides of the first through hole and the second through hole and on the top surface of the frame part at a region of a pattern connected to the second through hole; and a step of depositing metal on the plating foundation layer by plating to form a terminal and circuit component which includes at least a line and a circuit element and is provided only in a region just above the frame part.

According to the above configurations, the occurrence of corrosion of the connection portion between the terminal and the electrode pad can be suppressed.

DESCRIPTION OF EMBODIMENTS

Figure 1:
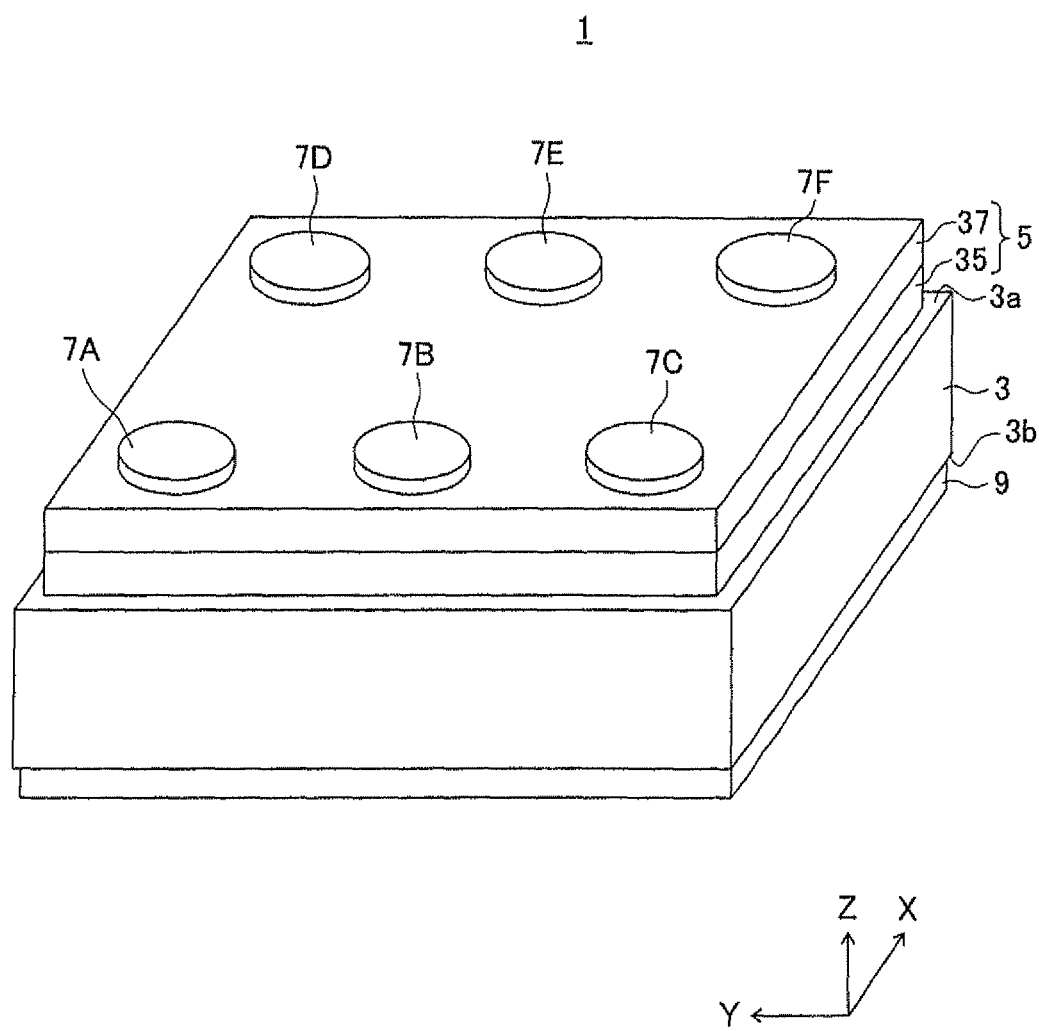
FIG. 1 A perspective view showing an appearance of a SAW device of a first embodiment of the present invention.

Below, SAW devices according to embodiments of the present invention are explained with reference to the drawings. Note that, the figures used in the following explanation are schematic ones. The dimensional ratios etc. in the drawings do not always coincide with the real ones. Further, in the embodiments explained, constituent elements the same or similar to already explained embodiments are assigned the same notations and explanations are omitted.

First Embodiment

Configuration of Saw Device

FIG. 1 is a perspective view of an appearance of a SAW device 1 according to a first embodiment of the present invention.

The SAW device 1 is configured by a so-called wafer level package (WLP) type SAW device. The SAW device 1 has a substrate 3, a cover 5 fixed to the substrate 3, a first terminal 7A to a sixth terminal 7F (hereinafter, these are sometimes simply referred to as "terminals 7" without differentiation) exposed from the cover 5, and a back surface part 9 arranged on the side of the substrate 3 opposite to the cover 5.

To the SAW device 1 is input a signal through any of the plurality of terminals 7. The input signal is filtered by the SAW device 1. Then, the SAW device 1 outputs the filtered signal through any of the plurality of terminals 7. The SAW device 1 is for example placed on the mount surface of a not shown circuit board or the like with the surface at the cover 5 side made to face the mount surface and resin-sealed in that state so as to be mounted in a state where the terminals 7 are connected to terminals on the mount surface.

The substrate 3 is configured by a piezoelectric substrate. Specifically, the substrate 3 is for example a block-shaped single crystal substrate which has a piezoelectric property such as a lithium tantalite single crystal, lithium niobate single crystal or the like. The substrate 3 has a first main surface $3a$ and a second main surface $3b$ on the back surface side thereof. The planar shape of the substrate 3 may be suitably set and is for example rectangular. The substrate 3 may be suitably set in size and is for example 0.2 mm to 0.5 mm in thickness and 0.5 mm to 2 mm in side length.

The cover 5 is arranged to cover the first main surface $3a$. The planar shape of the cover 5 is for example the same as the planar shape of the substrate 3 (rectangular in the present embodiment). The cover 5 has a width substantially equivalent to that of the first main surface $3a$ and covers substantially the entire surface of the first main surface $3a$.

The plurality of, terminals 7 are exposed from the top surface of the cover 5 (the surface on the side opposite to the substrate 3). The number of the plurality of terminals 7 is suitably set in accordance with the configuration of the electronic circuit inside the SAW device 1. The present embodiment exemplifies a case where six terminals 7 are arranged. The terminals 7 may be arranged at suitable positions and are for example aligned along the outer periphery of the cover 5. More specifically, four terminals 7 (7A, 7C, 7D, 7F) are arranged at four corners of the square. Further, two terminals 7 (7B, 7E) are arranged at centers of sides of the cover 5.

The back surface part 9, while not particularly shown, for example has a back surface electrode covering substantially the entire surface of the second main surface $3b$ and an insulating protection layer covering the back surface electrode. By the back surface electrode, an electric charge given to the substrate 3 surface due to a temperature change etc. is discharged. By the protection layer, damage to the substrate 3 is suppressed. Note that, in the following description, illustration and explanation of the back surface part 9 are sometimes omitted.

Figure 2:
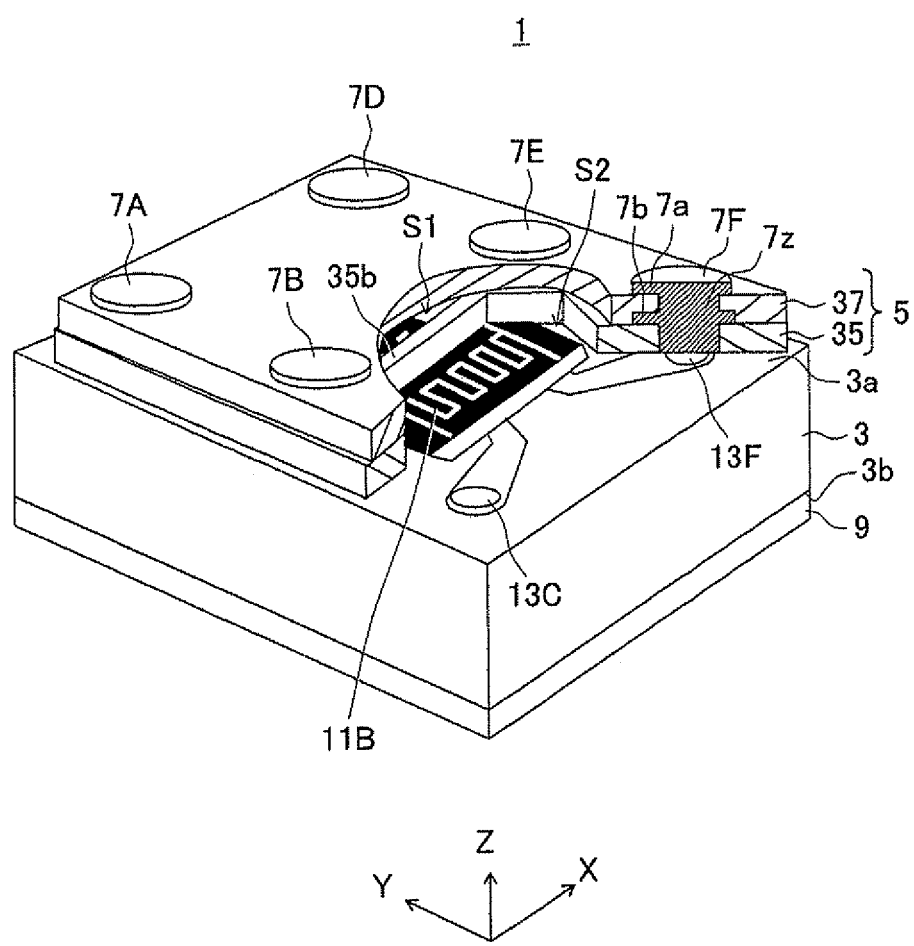
FIG. 2 A perspective view showing the SAW device of FIG. 1 by a cutaway view.

FIG. 2 is a perspective view of the SAW device 1 showing a portion of the cover 5 by a cutaway view.

On the first main surface $3a$, a SAW resonator 11A (see FIG. 3) and a SAW filter 11B are arranged. Note that, in the following description, the SAW resonator 11A and the SAW filter 11B are sometimes not differentiated, but are referred to as the "SAW elements 11". Note that, in FIG. 2, the SAW filter 11B is shown more diagrammatically than that in FIG. 3 which is explained later.

Figure 3:
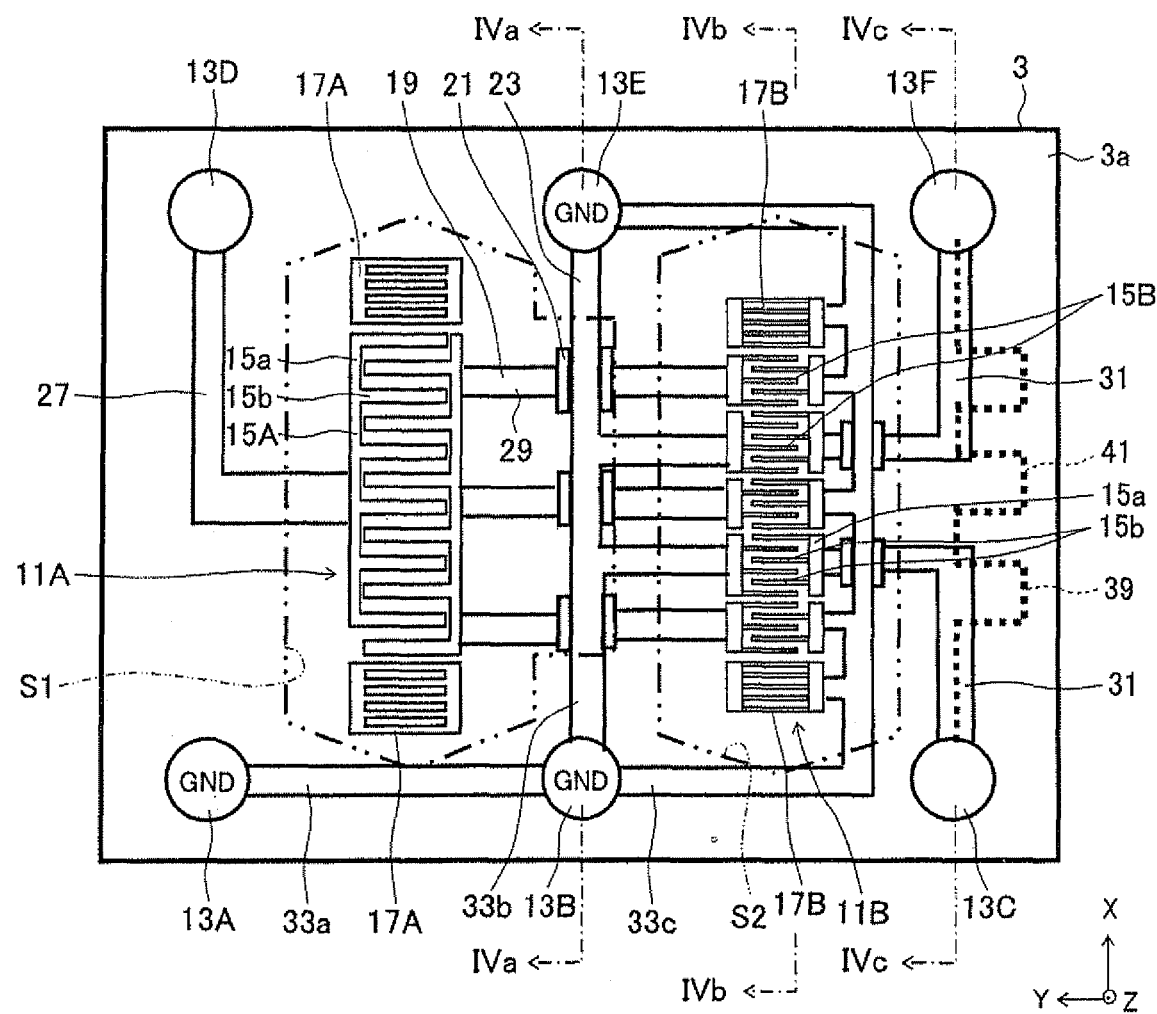
FIG. 3 A plan view showing a line structure of the SAW device of FIG. 1.

Further, on the first main surface $3a$, just under the first terminal 7A to the sixth terminal 7F, a first electrode pad 13A to a sixth electrode pad 13F (see FIG. 3 too. Hereinafter, these will be sometimes simply referred to as the "electrode pads 13" and will not be differentiated) are arranged. The electrode pads 13 are connected to the SAW elements 11. The terminals 7 are arranged so as to penetrate through the cover 5 and are connected to the SAW elements 11 by connection to the electrode pads 13.

The cover 5 covers the first main surface 3a so that a cavity is formed around the SAW elements 11. Specifically, the cover 5 forms a first vibration space S1 around the SAW resonator 11A and forms a second vibration space S2 around the SAW filter 11B. Note that, in the following description, these first vibration space S1 and second vibration space S2 are not sometimes differentiated, but are referred to as the "vibration spaces S".

FIG. 3 is a schematic plan view showing the line structure at the first main surface 3a of the substrate 3. Note that, in FIG. 3, the ranges of the vibration spaces S are indicated by two-dotted chain lines.

The SAW resonator 11A has for example an IDT (interdigital transducer) electrode 15A and two reflectors 17A which are arranged on the two sides of the IDT electrode 15A in the propagation direction of the SAW (X-direction).

The SAW filter 11B is configured by for example a longitudinally-coupled double-mode SAW filter. That is, the SAW filter 11B has a plurality of (for example five) IDT electrodes 15B and two reflectors 17B which are arranged on the two sides of the plurality of IDT electrodes 15B in the propagation direction of the SAW (X-direction).

The IDT electrodes 15A or 15B (hereinafter, A and B will be sometimes omitted) are respectively configured by pairs of electrodes. The pairs of electrodes have bus bars 15a which extend in the propagation direction of the SAW (X-direction) and pluralities of electrode fingers 15b which extend from the bus bars 15a in a direction perpendicular to the propagation direction (Y-direction) and are arranged so that the electrode fingers 15b mesh with each other. Note that, FIG. 3 is a schematic view, therefore the electrode fingers 15b are shown in a number smaller than the actual number. The SAW elements 11 are formed of an Al alloy, for example, an Al—Cu alloy.

Figure 4A:
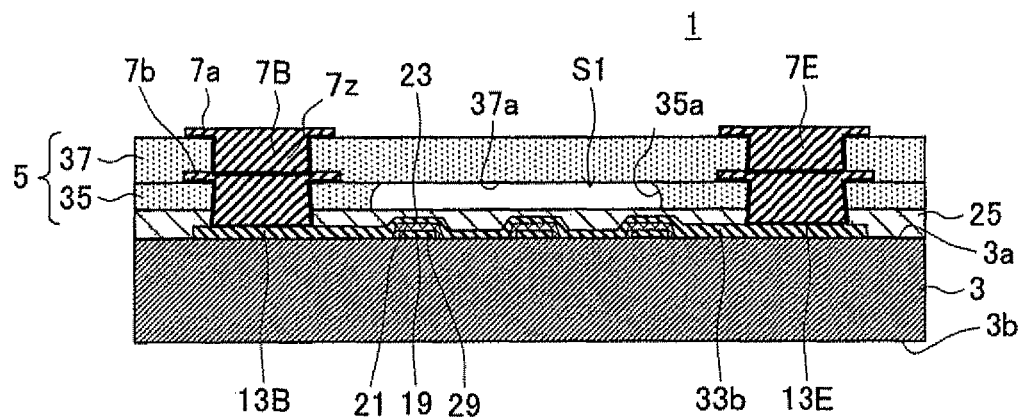
FIG. 4A is a cross-sectional view taken along a line IVa-IVa in FIG. 3.
Figure 4B:
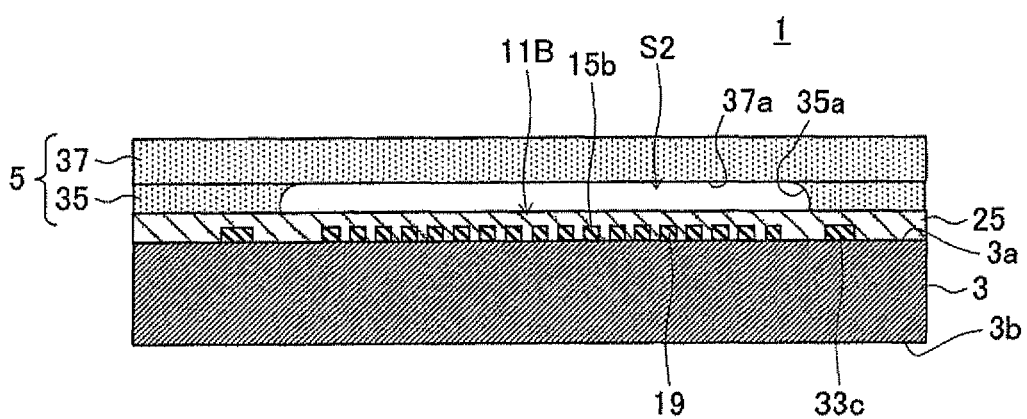
FIG. 4B is a cross-sectional view taken along a line IVb-IVb in FIG. 3.
Figure 4C:
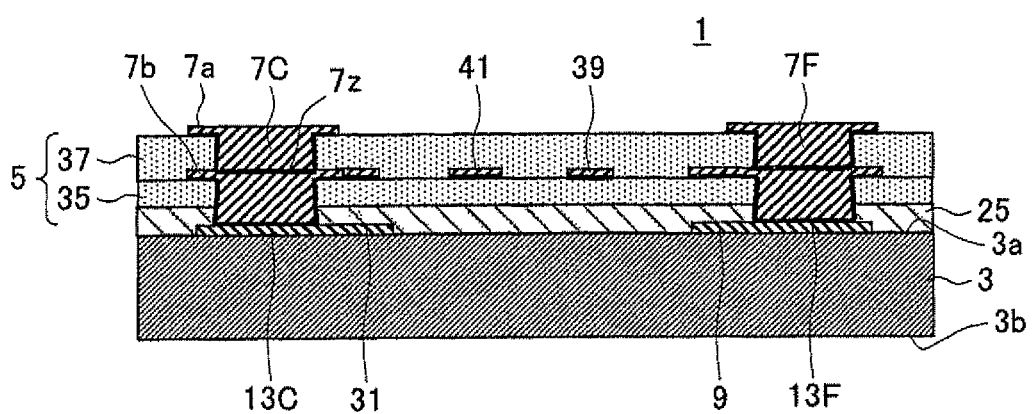
FIG. 4C is a cross-sectional view taken along a line IVc-IVc in FIG. 3.

FIG. 4A is a cross-sectional view taken along a line IVa-IVa in FIG. 3, FIG. 4B is a cross-sectional view taken along a line IVb-IVb in FIG. 3, and FIG. 4C is a cross-sectional view taken along a line IVc-IVc in FIG. 3.

On the first main surface 3a, a first conductive layer 19 including the SAW elements 11 (FIG. 4B), an insulation layer 21 (FIG. 4A) arranged on the first conductive layer 19, and a second conductive layer 23 (FIG. 4A) arranged on the insulation layer 21 are formed.

The first conductive layer 19 is the base layer for configuration of the circuit elements, lines, etc. on the first main surface 3a. The second conductive layer 23 is a layer which is stacked on the first conductive layer 19 with the insulation layer 21 between them and forms portions of the lines at a positions where lines given different potentials have to cross each other.

The first conductive layer 19 is formed of an Al alloy, for example, an Al—Cu alloy. The thickness thereof is for example 100 to 200 nm. The insulation layer 21 is formed of for example a photosensitive resin (for example, polyimide). The thickness thereof is for example 1 to 2 μm. The second conductive layer 23 is formed of for example gold, nickel, or chromium. The second conductive layer 23 is for example formed thicker than the first conductive layer 19 so as not to cause disconnections due to step differences caused by the insulation layer 21. The thickness thereof is for example 1 to 2 μm.

The line structures formed by the first conductive layer 19, insulation layer 21, and second conductive layer 23 may be suitably configured in accordance with the positions and structures of the terminals 7 and SAW elements 11. FIG. 3 illustrates line structures configured as follows.

The fourth terminal 7D (see fourth electrode pad 13D in FIG. 3) is for example a terminal to which a signal is input. This is connected to the SAW resonator 11A by an input side connection line 27 included in the first conductive layer 19.

The SAW resonator 11A and the SAW filter 11B are connected to each other by a plurality of intermediate connection lines 29 included in the first conductive layer 19.

The third terminal 7C and sixth terminal 7F (see third electrode pad 13C and sixth electrode pad 13F in FIG. 3) are for example terminals outputting signals and are connected to the SAW filter 11B by two output side connection lines 31 included in the first conductive layer 19.

The first terminal 7A, second terminal 7B, and fifth terminal 7E (see first electrode pad 13A and second electrode pad 13B and fifth electrode pad 13E in FIG. 3) are for example terminals given the reference potential. These terminals are connected to each other and are connected to the SAW filter 11B.

Specifically, the first terminal 7A and the second terminal 7B are connected by a first ground connection line 33a included in the first conductive layer 19. The second terminal 7B and the fifth terminal 7E are connected by a second ground connection line 33b configured by a second conductive layer 23 arranged above the intermediate connection lines 29. The second ground connection line 33b is branched at two points. Those branched parts are connected to the SAW filter 11B. Further, the second terminal 7B and the fifth terminal 7E are connected by a third ground connection line 33c configured by the second conductive layer 23 arranged above the output side connection line 31. The third ground connection line 33c is branched at three points. Those branched parts are connected to the SAW filter 11B.

As shown in FIG. 4A to FIG. 4C, a protection layer 25 and the cover 5 are stacked on the first conductive layer 19, insulation layer 21, and second conductive layer 23. Further, the cover 5 is configured by a frame part 35 stacked on the protection layer 25 and a lid part 37 stacked on the frame part 35.

The protection layer 25 contributes to prevention of oxidation etc. of the SAW elements 11. The protection layer 25 is for example formed of a material having an insulating ability and having a mass light enough that the propagation of SAW is not influenced. For example, the protection layer 25 is formed of a silicon oxide ($SiO_2$ etc.), silicon nitride, or silicon.

The thickness of the protection layer 25 may be suitably set and may be for example about 1/10 of the thickness of the first conductive layer 19 (10 to 20 nm). Note, in the present application, for convenience of explanation, a protection layer 25 thicker than the conductive layer is shown.

The frame part 35 is stacked on the first main surface 3a with the protection layer 25 between them and is formed to surround the SAW elements 11 in a plan view of the first main surface 3a. The lid part 37 is stacked on the frame part 35 and closes openings of the frame part 35. Vibration spaces S enabling vibration of the SAW elements 11 are formed by the spaces surrounded by the first main surface 3a (protection layer 25), frame part 35, and lid part 37.

Note that, strictly speaking, the cover 5 is not directly provided on the first main surface 3a of the substrate 3, but is provided on the protection layer 25 etc. In the present application, even the case where the predetermined members, layers, and so on are indirectly provided on the main surface of the substrate 3 in this way and are not directly provided on the main surface of the substrate 3, these predetermined members and layers are sometimes expressed as being provided on the main surface of the substrate 3. This same is true for the word "stacked" too.

The frame part 35 is configured by forming one or more (two in the present embodiment) openings which become the vibration spaces S in a layer having substantially a constant thickness. Note that, the shape indicated by solid lines showing the contours of the substrate 3 (first main surface 3a) and by two-dotted chain lines showing ranges of the vibration spaces S is substantially the same as the planar shape of the frame part 35.

In the present embodiment, the vibration space is separated into two due to the formation of a partition wall 35b (FIG. 2) for improving the support strength of the lid part 37 by the frame part 35. Accordingly, so far as the required support strength is obtained, in the SAW device 1, the partition wall 35b may be omitted, and two SAW elements 11 may be arranged in one vibration space.

The frame part 35 and the lid part 37 are configured by layers each having substantially a constant thickness. The thickness of the frame part 35 (height of the vibration space S) is for example several micrometers to 30 µm. The thickness of the lid part 37 is for example several micrometers to 30 µm.

The frame part 35 and lid part 37 are formed of for example a photosensitive resin. The photosensitive resin is for example a urethane acrylate-based, polyester acrylate-based, or epoxy acrylate-based resin which is cured by radical polymerization of acryl groups, methacryl groups, and so on.

Note that, the frame part 35 and the lid part 37 can be formed of not only the same material, but also materials different from each other. In the present application, for convenience of explanation, a border line of the frame part 35 and the lid part 37 is clearly shown. However, in actual products, the frame part 35 and the lid part 37 may be formed integrally by the same material as well. Note that, also in this case, the boundary of the frame part 35 and the lid part 37 can be identified by the position of the ceiling of the vibration spaces S (the bottom surface of the lid part 37).

The vibration spaces S are formed so that, as shown in FIG. 4A and FIG. 4B, their cross-sections are substantially rectangular and their corner portions at the lid part 37 side are rounded. In other words, the inner wall 35a and ceiling 37a configuring the vibration spaces S are formed in arch shapes.

As shown in FIG. 4C, in the SAW device 1 of the present embodiment, a third conductive layer 39 is arranged between the frame part 35 and the lid part 37. The third conductive layer 39 extends from the side surfaces of columnar portions of the terminals 7 and is covered by the cover 5. The third conductive layer 39 is a portion of projections 7b of the terminals 7 and configures an inductor 41. Specifically, this is as follows.

As shown in FIG. 4A and FIG. 4C, each terminal 7 has a column part 7z setted up on the electrode pad 13 and a land 7a and projection 7b which are projected sideward from the column part 7z.

The column part 7z is formed in a for example substantially columnar shape. The size of the column part 7z in a plan view of the first main surface 3a is small compared with the size of the vibration spaces S in a plan view of the first main surface 3a. As one example, in a plan view of the first main surface 3a, relative to the 500 µm×500 µm size of the vibration spaces S, the diameter of the column part 7z is 100 µm.

The column part 7z is formed in a tapered shape so that its first main surface 3a side is enlarged in diameter more than its side opposite to the first main surface 3a. The terminal 7 is sometimes pulled out after the SAW device 1 is mounted on the circuit board or the like. However, by forming the column part 7z in such a tapered shape so that its first main surface 3a side is enlarged in diameter more than its side opposite to the first main surface 3a as in the present embodiment, occurrence of such pull-out can be suppressed.

The land 7a is projected from the side surface of the upper end of the column part 7z and is stacked on the top surface of the lid part 37. The land 7a is formed in a ring shape surrounding the column part 7z. The shape of the outer edge of the land 7a may be suitably set and is for example a round shape. By providing the land 7a, the portion of the terminal 7 which is exposed on the top surface of the lid part 37 is formed so that its area is broader than the cross-section of the column part 7z parallel to the first main surface 3a.

The projection 7b is projected from the side surface of the column part 7z and is located between the frame part 35 and the lid part 37. The projection 7b is formed in a ring shape surrounding the column part 7z. In other words, the projection 7b is connected to the column part 7z over the entire circumference of the side surface. Further, the projection 7b is formed in a plate shape (layer shape). The shape of the outer edge of the projection 7b may be suitably set and is for example a round shape. The width of the portion of the projection 7b which is projected from the side surface of the column part 7z is for example 1.0 µm to 10 µm.

As indicated by a dotted line in FIG. 3, the inductor 41 is configured by for example a meander type inductor pattern. The inductor 41 is arranged between the third terminal 7C and the sixth terminal 7F (see third electrode pad 13C and sixth electrode pad 13F in FIG. 3), that is, between two output terminals of the SAW device 1. The inductor 41 configures a matching circuit for impedance matching. Note that, the shape of the inductor 41 is not limited to a meander type. A spiral type or linear type, a combination of the same, and other various shapes are also possible.

As shown in the cross-sectional view of FIG. 4C, the column parts 7z of the third terminal 7C and sixth terminal 7F to which the inductor 41 is connected have taper-shaped cross-sectional shapes. Since the cross-sectional shapes of the column parts 7z to which the inductor 41 is connected become tapered shapes in this way, the area of a connection portion between the third conductive layer 39 configuring the inductor 41 and the column parts 7z increases. Therefore, separation of the inductor 41 and the column part 7z becomes difficult, so an acoustic wave device excellent in reliability can be obtained. More preferably, the column parts 7z are given a tapered shape so that their diameters are enlarged toward the main surface side of the piezoelectric substrate 3. Due to such a shape given to the column parts 7z, even in a case where a force pulling out a terminal is applied, pull-out of the terminal is suppressed. Therefore, occurrence of deformation in the shape of the inductor 41 connected to that terminal can be suppressed as well.

The thickness of the third conductive layer 39 is for example 0.5 µm to 2.0 µm. The third conductive layer 39 may be formed of a material different from that for the column parts 7z or may be formed of the same material as that for the column parts 7z. Note, preferably the third conductive layer 39 is formed of the same material as that for the column parts 7z in order to make the joint with the column parts 7z strong.

Figure 5:
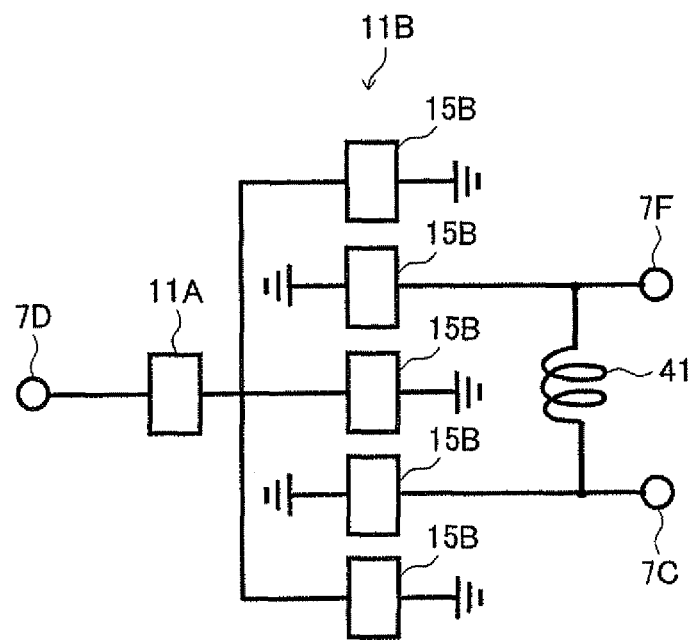
FIG. 5 An equivalent circuit diagram of the SAW device of FIG. 1.

FIG. 5 is an equivalent circuit diagram of the SAW device 1. Note that, in FIG. 5, the entire SAW resonator 11A including the IDT electrode 15A and reflectors 17A is indicated by one block. Further, the reflectors 173 of the SAW filter 118 are omitted in illustration.

A signal input to the fourth terminal 7D as an input terminal is input to the SAW resonator 11A. Note that, this signal is for example an unbalanced signal. The SAW resonator 11A outputs a signal resonating with the input signal to the SAW filter 113. The SAW filter 11B filters the input signal and outputs the result to the third terminal 7C and sixth terminal 7F as output terminals. Note that, this signal is for example a balanced signal. The inductor 41 performs impedance matching between the SAW device 1 and an electronic circuit connected to the SAW device 1.

According to the above SAW device 1, the SAW device 1 has a substrate 3 through which acoustic waves propagate, the IDT electrode 15 arranged on the first main surface 3a of the substrate 3, and the electrode pad 13 which is electrically connected to the IDT electrode 15 and is arranged on the first main surface 3a. Further, the SAW device 1 has the terminal with a pillar-shape (column part 7z) which is arranged on the electrode pad 13 in a standing state, the projection 7b which extend from the side surface of the column part 7z, and the cover 5 which forms hollow the vibration space S above the IDT electrode 15 and covers the side surface of the column part 7z and the projection 7b. Accordingly, various effects can be obtained by the projection 7b. Specifically, these are as follows.

The projection 7b is connected to the column part 7z over the entire periphery of the side surface of the column part 7z. Accordingly, a bonding area of the entire terminal 7 including the projection 7b with the cover 5 increases, therefore the cover 5 becomes difficult to peel off from the terminal 7. In addition, even if peeling occurs, moisture trying to invade the inside from the peeled portion is blocked from entry by the projection 7b, therefore it becomes difficult for the moisture to reach the bottom end of the terminal 7. Accordingly, corrosion of the joint portion between the terminal 7 and the electrode pad 13 can be suppressed, so an acoustic wave device having high reliability can be provided.

The third conductive layer 39 has the circuit component (inductor 41). Accordingly, the SAW device 1 can be given multiple functions without increasing the size of the SAW device 1. Further, the inductor 41 is covered by the cover 5, therefore it is not necessary to provide a new member for insulation and protection of the inductor 41, so the configuration of the SAW device 1 is simplified.

The inductor 41 (circuit component) is arranged only in a region just above the frame part 35.

Here, the region just above the frame part 35 is wholly supported by the first main surface 3a, therefore a bending deformation is harder to occur than the region just above the vibration space S in which the two ends are supported. Accordingly, it is meant that the inductor 41 is centrally arranged in the region in the cover 5, in which the bending deformation hardly occurs. Then, the inductor 41 is suppressed in the change of electric characteristics along with the deformation of the cover 5. Further, the circuit component is arranged at position where does not overlap the SAW element 11 in a perspective plane view of the cover 5, therefore reduction of parasitic capacitance generated between the SAW element 11 and the inductor 41 is expected as well.

The third conductive layer 39 is arranged between the frame part 35 and the lid part 37. In other words, the position of the third conductive layer 39 from the first main surface 3a coincides with the position of the ceiling 37a of the vibration space S from the first main surface 3a. Therefore, compared with a case where the third conductive layer 39 is buried in the lid part 37, the configuration and manufacturing process of the lid part 37 can be simplified. That is, as in this embodiment, the manufacturing process of previously forming the frame part 35 and then stacking the lid part 37 on the frame part 35 can be utilized, so it is not necessary to form the lid part from two layers of resin.

The frame part 35 and the lid part 37 are made of the same material. Accordingly, the thermal expansion ratios of the frame part 35 and the lid part 37 are the same, so strain and deformation of the cover 5 due to a thermal expansion difference are suppressed. Consequently, the deformation of the inductor 41 is suppressed, and the electrical characteristics are stabilized.

(Method for Manufacturing Saw Device)

Figure 6A:
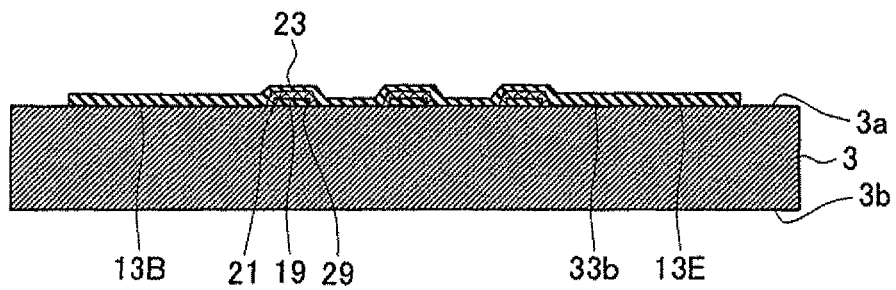
FIG. 6A to FIG. 6D are cross-sectional views taken along the line IVa-IVa in FIG. 3 for explaining a method for manufacturing the SAW device of FIG. 1.
Figure 6B:
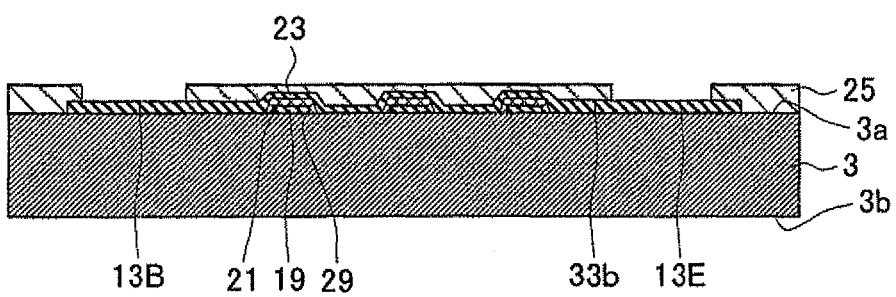
Figure 6C:
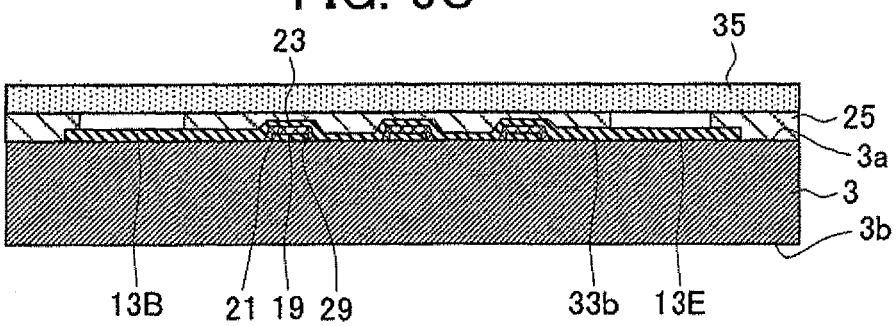
Figure 6D:
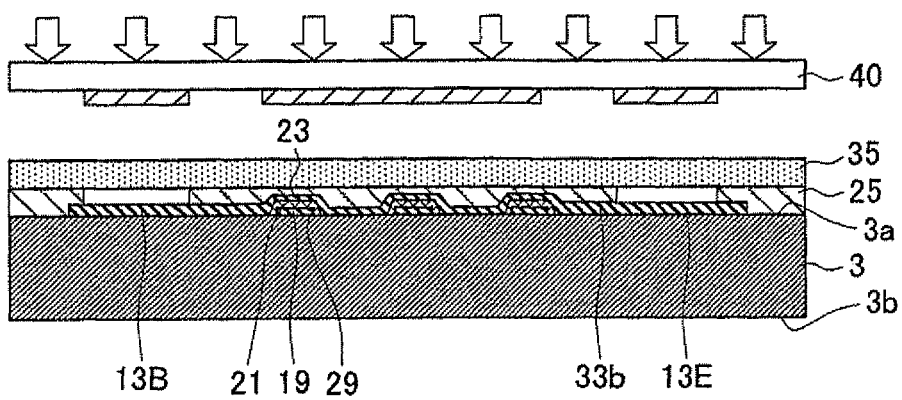
Figure 7A:
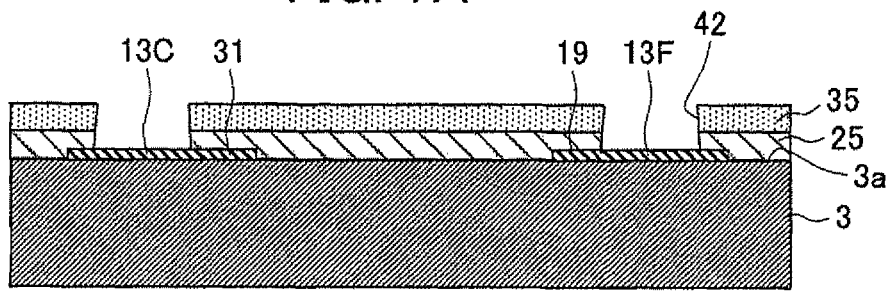
FIG. 7A to FIG. 7D are cross-sectional views taken along the line IVC-IVc in FIG. 3 which explains a continuation of FIG. 6D.
Figure 7B:
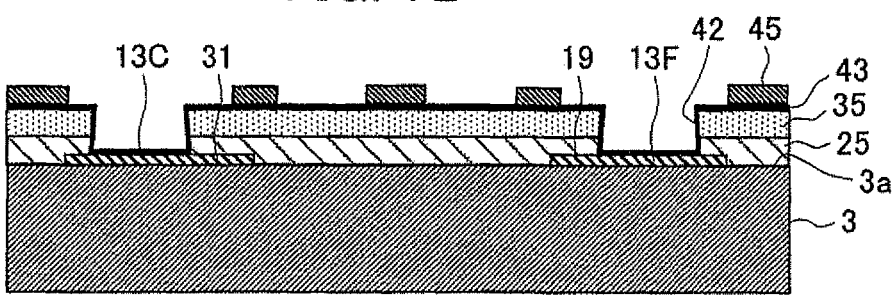
Figure 7C:
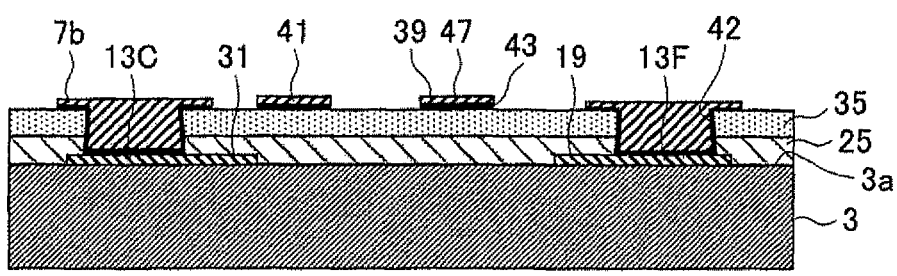
Figure 7D:
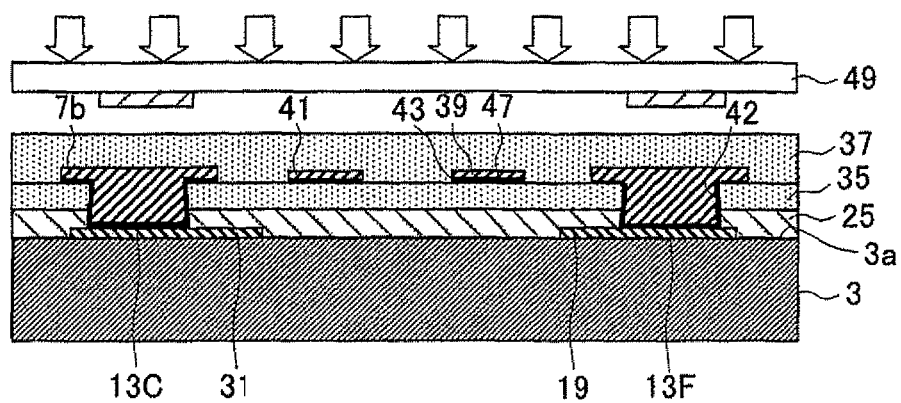
Figure 8A:
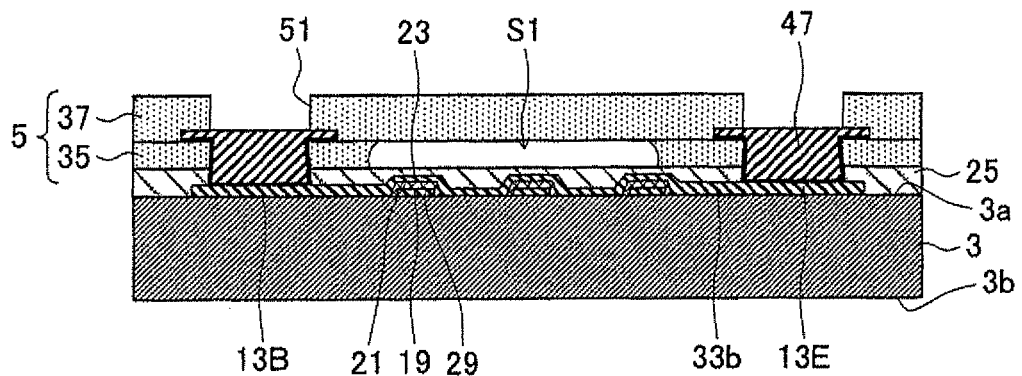
FIG. 8A to FIG. 8C are cross-sectional views taken along the line IVa-IVa in FIG. 3 which explains a continuation of FIG. 7D.
Figure 8B:
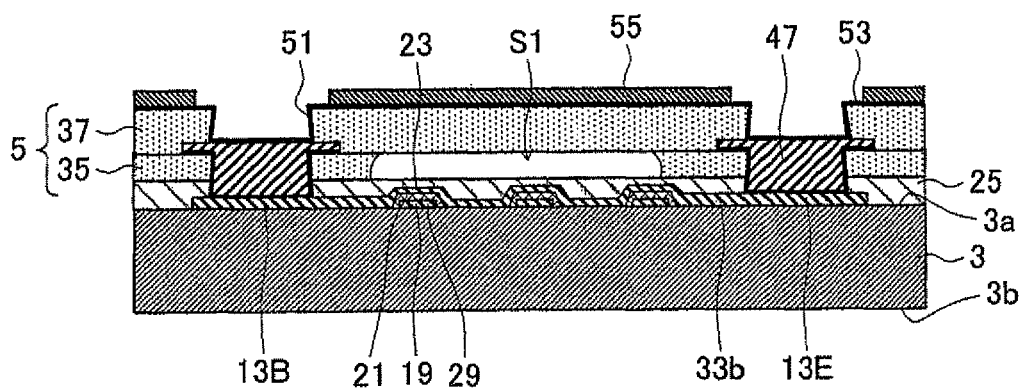
Figure 8C:
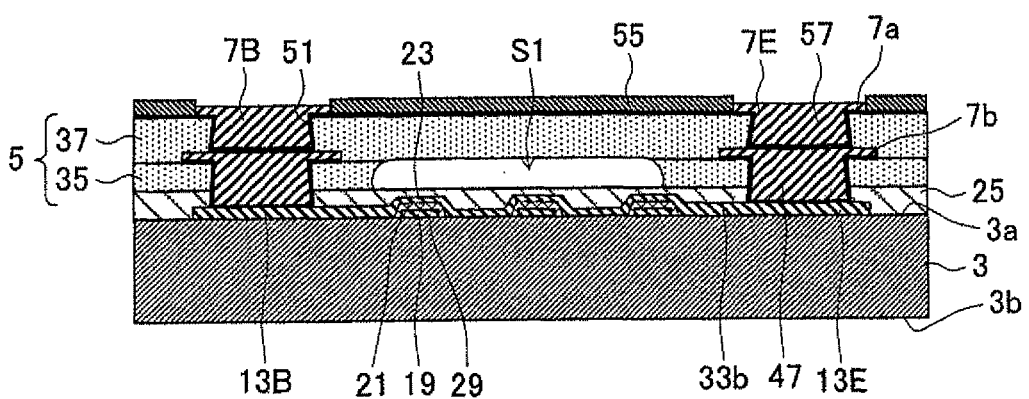

FIG. 6 to FIG. 8 are diagrams explaining the method for manufacturing the SAW device 1. Specifically, FIG. 6A to FIG. 6D are cross-sectional views taken along a line IVa-IVa in FIG. 3. FIG. 7A to FIG. 7D are cross-sectional views taken along a line IVc-IVc in FIG. 3. FIG. 8A to FIG. 8D are cross-sectional views taken along a line IVa-IVa in FIG. 3. The manufacturing steps are advanced in order from FIG. 6A to FIG. 8D.

The steps explained below are realized in a so-called wafer process. That is, a mother board which is later divided to form substrates 3 is formed with thin films, patterned by photolithography, etc. After that, it is diced to form a large number of the SAW devices 1 in parallel. Note, in FIG. 6 to FIG. 8, only the portion corresponding to one SAW device 1 is shown. This is true for the diagrams explaining manufacturing steps of the other embodiments explained later. Further, the conductive layer and insulation layer change in shapes along with the progress of the process. However, for facilitation of understanding, common notations are used before and after the change.

As shown in FIG. 6A, first, on the first main surface 3a of the substrate 3, a first conductive layer 19, insulation layer 21, and second conductive layer 23 are formed.

Specifically, first, by thin film formation process such as sputtering process, vapor deposition process, or CVD (chemical vapor deposition) process, or the like, a metal layer which becomes the first conductive layer 19 is formed on the first main surface 3a of the substrate 3. Next, the metal layer is patterned by a photolithography process or the like which uses a reduced projection exposure apparatus (stepper) and RIE (reactive ion etching) apparatus. Accordingly, the first conductive layer 19 including the SAW elements 11, electrode pads 13, input side connection line 27, intermediate connection lines 29, output side connection lines 31, first ground connection line 33a, etc. is formed.

Next, a thin film which becomes the insulation layer 21 is formed by thin film formation process such as the CVD process, vapor deposition process, or the like. Then, leaving the region which becomes the intersection portion of the first conductive layer 19 and the second conductive layer 23, part of the thin film is removed by the photolithography process.

After that, in the same way as the first conductive layer 19, by formation and patterning of a metal layer, a second conductive layer 23 including a second ground connection line 33b and third ground connection line 33c is formed.

When the second conductive layer 23 is formed, as shown in FIG. 6B, the protection layer 25 is formed. Specifically, first, a thin film which becomes the protection layer 25 is formed on the first main surface 3a by thin film formation process such as the CVD process, vapor deposition process, or the like. Next, a part of the thin film is removed by the photolithography process so that the electrode pads 13 are exposed. Therefore, the protection layer 25 is formed.

When the protection layer 25 is formed, as shown in FIG. 6C, a thin film which becomes the frame part 35 is formed. The thin film is formed for example by adhesion of a film formed of a photosensitive resin or by the same thin film formation process as that for the protection layer 25 etc.

When the thin film which becomes the frame part 35 is formed, as shown in FIG. 6D, the photolithography process is carried out. Note that, the photolithography may be either of the positive type or negative type. However, in FIG. 6D, a photomask 40 in the case of a negative type is exemplified.

When photolithography is carried out, as shown in FIG. 7A, a portion of the thin film is removed, and the frame part 35 is formed. Accordingly, openings of the frame part 35 (portions which become the vibration spaces S) are formed. Further, above the electrode pads 13, first through holes 42 which penetrate through the frame part 35 to expose the electrode pads 13 are formed.

When the frame part 35 is formed, as shown in FIG. 7B, a first plating foundation layer 43 and a first resist layer 45 are formed.

The first plating foundation layer 43 is formed over the entire surface, exposed at the first main surface 3a side, of each of the layers arranged on the first main surface 3a. That is, the first plating foundation layer 43 is formed not only on the top surface of the frame part 35, but also in the insides of the first through holes 42. The first plating foundation layer 43 is configured by for example a laminate of Ti and Cu and is formed by a sputtering process as a preferred example.

The first resist layer 45 is formed on the first plating foundation layer 43. The first resist layer 45 is formed by, for example, forming a thin film on the substrate by spin coating or another technique and patterning that thin film by photolithography. By removal of a portion of the thin film by patterning, the first plating foundation layer 43 is exposed from the first resist layer 45 in the region where the third conductive layer 39 must be formed and in the first through holes 42.

When the first resist layer 45 is formed, as shown in FIG. 7C, a first metal 47 is deposited at the exposed portions of the first plating foundation layer 43 by plating, then the portion of the first plating foundation layer 43 which was covered by the first resist layer 45 and the first resist layer 45 are removed. Accordingly, the third conductive layer 39 and the portions of the terminals 7 on the substrate 3 side are formed.

Note that, the plating is carried out so that the first metal 47 is deposited up to a suitable height which is not more than the surface of the first resist layer 45. The plating method may be suitably selected, but the electroplating method is preferred. This is because the electroplating method has a high degree of freedom in the height of deposition of a metal and gives a good adhesivity with the first plating foundation layer 43.

When the first resist layer 45 etc. are removed, as shown in FIG. 7D, a thin film which becomes the lid part 37 is formed and photolithography is carried out. The thin film is formed of for example adhesion of a film formed of a photosensitive resin. By stacking the thin film on the frame part 35, the openings of the frame part 35 are closed, and the vibration spaces S are formed. The photolithography may be either of a positive type or negative type, but a photo-mask 49 in the case of a negative type is exemplified in FIG. 7D.

When the photolithography is carried out, as shown in FIG. 8A, a portion of the thin film is removed, and the lid part 37 is formed. Therefore, on the electrode pads 13, second through holes 51 for exposing the first metal 47 filled in the first through holes 42 are formed.

When the lid part 37 is formed, as shown in FIG. 8B, a second plating foundation layer 53 and second resist layer 55 are formed.

The second plating foundation layer 53 is formed over the entire surface, exposed at the first main surface 3a side, of each of the layers arranged on the first main surface 3a. That is, the second plating foundation layer 53 is formed not only on the top surface of the lid part 37, but also inside the second through holes 51. Further, the second resist layer 55 is formed so that the second plating foundation layer 53 is exposed in the second through holes 51. The method of formation of the second plating foundation layer 53 and second resist layer 55 is the same as the method of formation of the first plating foundation layer 43 and first resist layer 45.

When the second resist layer 55 is formed, as shown in FIG. 8C, the second metal 57 is deposited at the exposed portions of the second plating foundation layer 53 by plating. Accordingly, the second metal 57 is filled in the second through holes 51. After that, by removal of the portion of the second plating foundation layer 53 which was covered by the second resist layer 55 and removal of the second resist layer 55, as shown in FIG. 4 etc., the terminals 7 are formed of the second metal 57 filled in the second through holes 51 etc.

Note that, the formation of the vibration spaces S in the arch shapes (see FIG. 4A) and the formation of the first through holes 42 and second through holes 51 in the tapered shapes so that their first main surface 3a sides are enlarged in diameter result from the negative type photolithography. That is, the first main surface 3a side of the photosensitive resin is not sufficiently cured due to diffusion of light compared with the front surface side of the photosensitive resin, so it is easily removed. Therefore, the vibration spaces S etc. enlarge in diameters toward the first main surface 3a side.

Next, the method for manufacturing the SAW device 1 is explained. The method for manufacturing the SAW device 1 of the present embodiment has the following steps: the step of forming the SAW element 11 and the electrode pad 13 connected to the SAW element 11 on the first main surface 3a of the substrate 3 (FIG. 6A); the step of forming the frame part 35 which is stacked on the first main surface 3a, is formed in the shape of a frame surrounding the SAW element 11 in a plan view of the first main surface 3a, and has the first through hole 42 formed therein that exposes the electrode pad 13 (FIG. 6C to FIG. 7A); the step of forming the first plating foundation layer 43 in the inside of the first through hole 42 and on the top surface of the frame part 35 (FIG. 7B); the step of forming the first resist layer 45 on the first plating foundation layer 43 which exposes the first plating foundation layer 43 in the first through hole 42 and on portions of the top surface of the frame part 35 at the pattern connected to the first through hole 42 (FIG. 7B); the step of depositing the first metal 47 on the first plating foundation layer exposed from the first resist layer 45 by plating (FIG. 7C); the step of removing the first resist layer 45 and the portion of the first plating foundation layer 43 which was covered by the first resist layer 45 and forming the third conductive layer 39 by the first plating foundation layer 43 by the above predetermined pattern and by the first metal 47 (FIG. 7C); the step of forming the lid part 37 which is formed in the shape of a lid stacked on the frame part 35 and closing the opening of the frame part 35, and has the second through holes 51 formed therein that expose the first metal 47 in the first through holes 42 (FIG. 7D to FIG. 8A); and the step of filling the second metal 57 in the second through holes 51 and forming the terminal 7 by the first metal 47 in the first through hole 42 and the second metal 57 filled in the second through hole 51 (FIG. 8B to FIG. 8C).

Accordingly, the step of forming the third conductive layer 39 is included in the step of forming the terminal (column part 7z). That is, the third conductive layer 39 is simply formed. Note that, the terminal 7 is formed in a 2-divided manner. Therefore, for example, the effect that the depth of the metal filled in the through hole becomes shallow, so the formation of the terminal is facilitated, and other effects are exhibited.

Note that, in the above first embodiment, the SAW device 1 is one example of the acoustic wave device of the first aspect of the present invention, the IDT electrode 15 is one example of the excitation electrode of the present invention, the inductor 41 or third conductive layer 39 is one example of the projection of the present invention, and the inductor 41 is one example of the circuit component of the present invention. Further, the method for manufacturing the SAW device 1 is one example of the method for manufacturing the acoustic wave device of the second aspect of the present invention.

Second Embodiment

Figure 9:
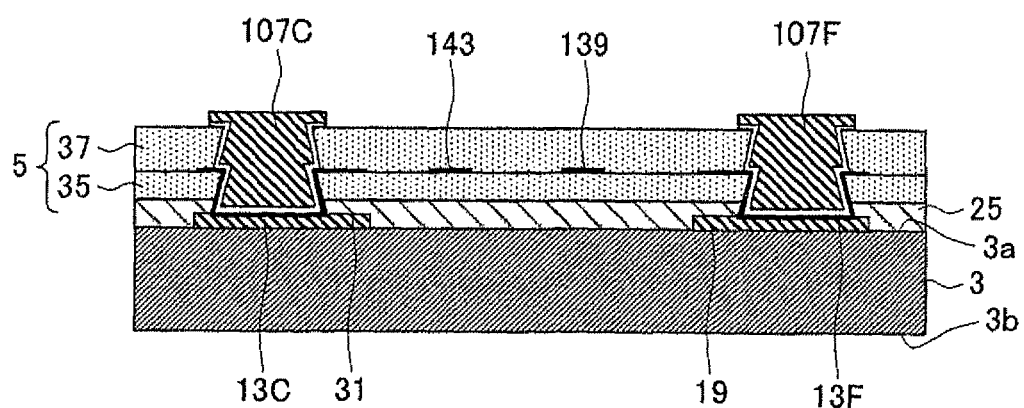
FIG. 9 A cross-sectional view corresponding to the line IVc-IVc in FIG. 3, which shows a SAW device of a second embodiment of the present invention.

FIG. 9 is a cross-sectional view corresponding to the line IVc-IVc in FIG. 3 and shows a SAW device 101 of a second embodiment of the present invention.

The configuration of the SAW device 101 of the second embodiment is substantially the same as that of the SAW device 1 of the first embodiment. See FIG. 1 to FIG. 3 of the first embodiment for the perspective view etc. of the SAW device 101.

In the first embodiment, the third conductive layer 39 was configured by the first plating foundation layer 43 and the first metal 47 deposited on the first plating foundation layer 43 (FIG. 7B and FIG. 7C). On the other hand, in the second embodiment, a third conductive layer 139 is formed by only a first plating foundation layer 143.

Figure 10A:
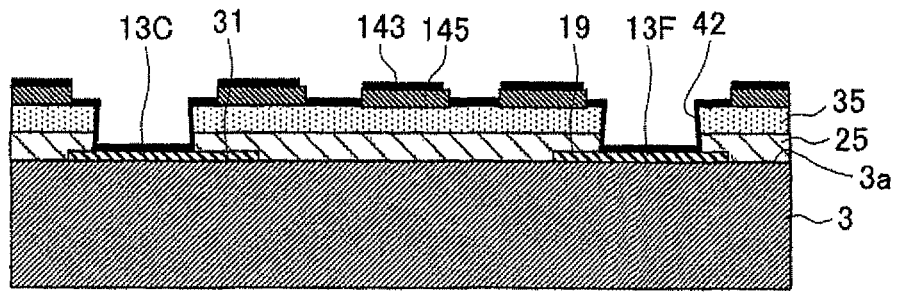
FIG. 10A to FIG. 10C are cross-sectional views corresponding to the line IVc-IVc in FIG. 3 for explaining the method for manufacturing the SAW device of FIG. 9.
Figure 10B:
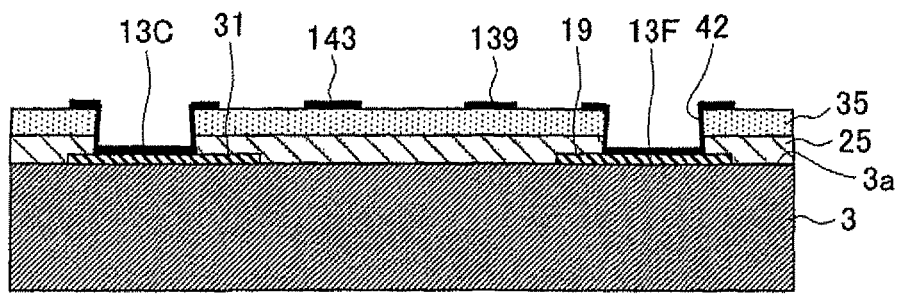
Figure 10C:
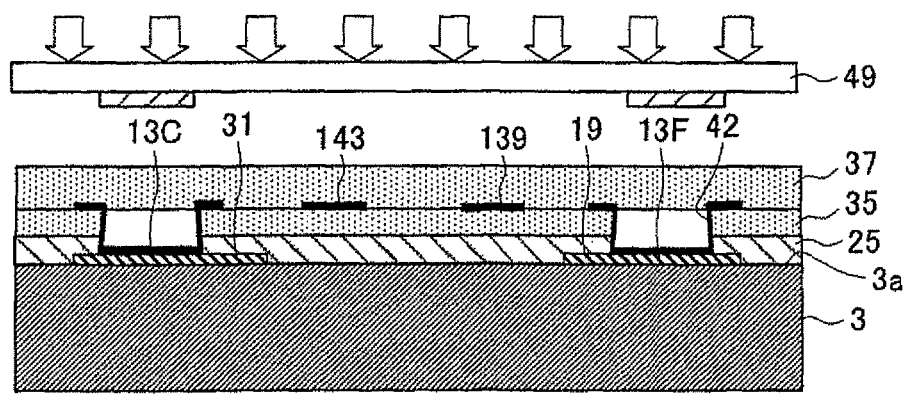

FIG. 10 and FIG. 11 are diagrams explaining the method for manufacturing the SAW device 101. Specifically, FIG. 10A to FIG. 10C are cross-sectional views corresponding to the cross-sectional views taken along the line IVc-IVc in FIG. 3. FIG. 11A to FIG. 11D are cross-sectional views corresponding to the cross-sectional views taken along the line IVa-IVa in FIG. 3. The manufacturing steps are advanced in order from FIG. 10A to FIG. 11D.

In the method for manufacturing the SAW device 101, first, in the same way as the first embodiment, the manufacturing steps from FIG. 6A to FIG. 7A are carried out. That is, the production up to the formation of the frame part 35 is carried out in the same way as the first embodiment.

Next, as shown in FIG. 10A, a first resist layer 145 and first plating foundation layer 143 are formed. Here, in contrast to the first embodiment in which the first resist layer 45 was formed on the first plating foundation layer 43, in the second embodiment, the first plating foundation layer 143 is formed on the first resist layer 145.

The formation method and patterns of the first resist layer 145 are the same as the formation method and patterns of the first resist layer 45 in the first embodiment except for the point that this layer is formed on the frame part 35. Then, from the first resist layer 145, regions of the top surface of the frame part 35 at which the third conductive layer 139 must be formed and the first through holes 42 are exposed.

The first plating foundation layer 143 is formed over the entire surface, exposed at the first main surface 3a side, of the layers provided on the first main surface 3a in the same way as the first embodiment. Note, the first plating foundation layer 143 is formed relatively thick. For example, the first plating foundation layer 143 is formed to a thickness of 1.0 μm to 10 μm.

When the first plating foundation layer 143 is formed, as shown in FIG. 10B, the first resist layer 145 and the portions of the first plating foundation layer 143 above the first resist layer 145 are removed. Accordingly, the third conductive layer 139 is formed.

After that, as shown in FIG. 10C, a thin film which becomes the lid part 37 is formed and is patterned by photolithography. This step is the same step as that in FIG. 7D in the first embodiment.

Figure 11A:
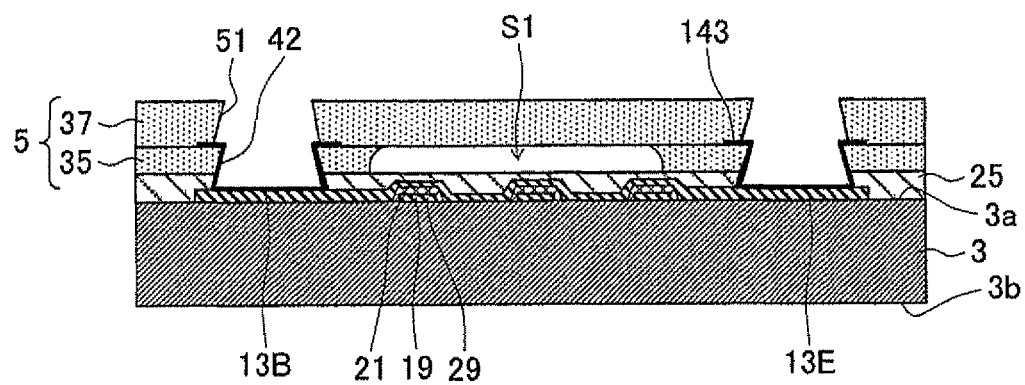
FIG. 11 A cross-sectional view corresponding to the line IVa-IVa in FIG. 3 which explains a continuation of FIG. 10C.

When photolithography is carried out, as shown in FIG. 11A, a portion of the thin film is removed, and the lid part 37 is formed. Accordingly, the second through holes 51 exposing the first through holes 42 are formed above the electrode pads 13.

Figure 11B:
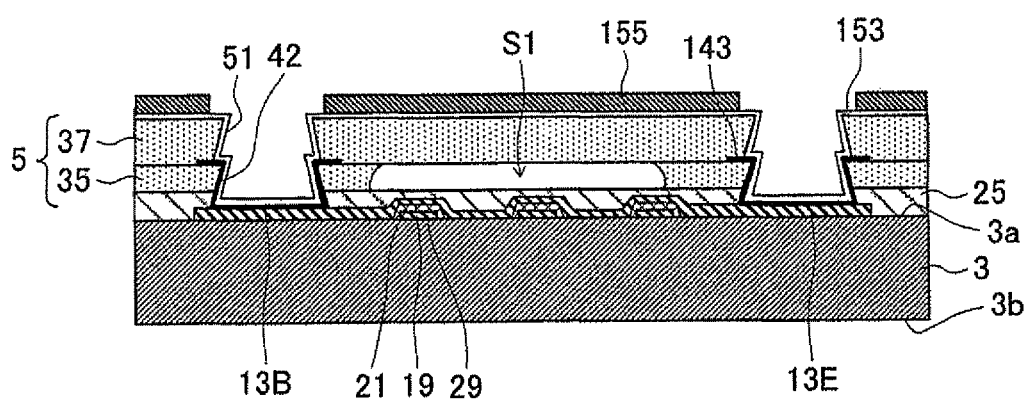

When the lid part 37 is formed, as shown in FIG. 11B, a second plating foundation layer 153 and second resist layer 155 are formed.

The second plating foundation layer 153 is formed over the entire surface, exposed at the first main surface 3a side, of the layers provided on the first main surface 3a. That is, the second plating foundation layer 153 is formed not only on the top surface of the lid part 37, but also inside the first through holes 42 and second through holes 52. Further, the second resist layer 155 is formed so that the second plating foundation layer 153 is exposed in the first through holes 42 and the second through holes 51.

Figure 11C:
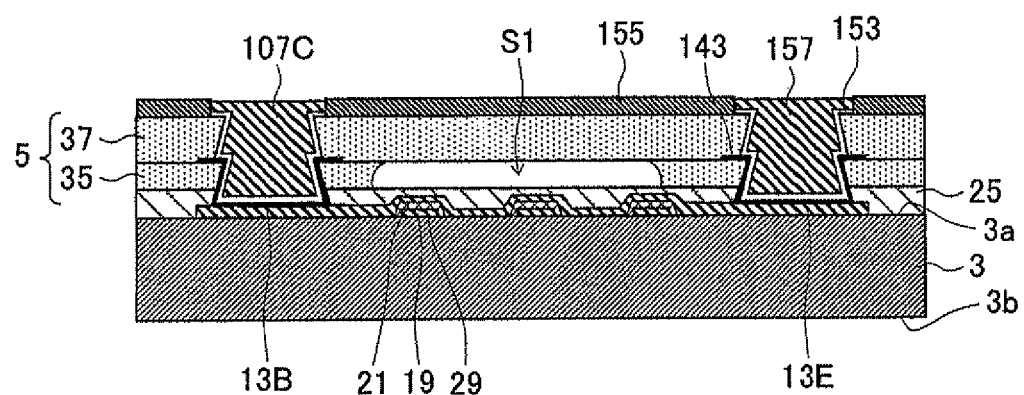

When the second resist layer 155 is formed, as shown in FIG. 11C, a metal 157 is deposited at the exposed portions of the second plating foundation layer 153 by plating. Accordingly, the metal 157 is filled in the first through holes 42 and second through holes 51.

Figure 11D:
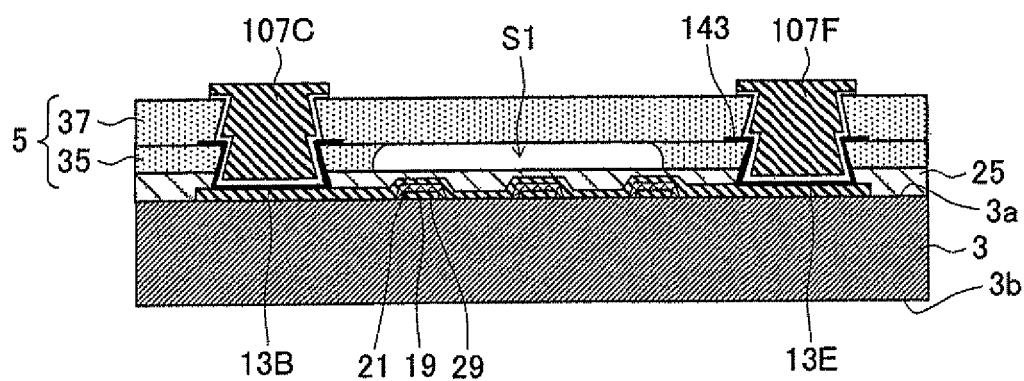

After that, as shown in FIG. 11D, by removal of the portions of the second plating foundation layer 153 which were covered by the second resist layer 155 and removal of the second resist layer 155, terminals 107 (attached notations A to F are the same as those in the first embodiment) are formed of the metal 157 filled in the first through holes 42 and second through holes 51 etc.

According to the SAW device 101 of the second embodiment described above, in the same way as the first embodiment, the same effects as those by the first embodiment are exhibited because of the provision of the third conductive layer 139 which extends from the side surface of the column part 7z.

Further, the method for manufacturing the SAW device 10 of the second embodiment has the following steps: the step of forming the SAW element 11 and the electrode pad 13 connected to the SAW element 11 on the first main surface 3a of the substrate 3 (FIG. 6A); the step of forming the frame part 35 which is stacked on the first main surface 3a, is formed in the shape of a frame surrounding the SAW element 11 in a plan view of the first main surface 3a, and has the first through hole 42 formed therein that exposes the electrode pad 13 (FIG. 6C to FIG. 7A); the step of forming the electrically conductive first plating foundation layer 143 inside the first through hole 42 and in the region of the pattern connected with the first through hike 42 at the top surface of the frame part 35 and forming the third conductive layer 39 by the first plating foundation layer 143 in the region of the predetermined pattern (FIG. 10A, to FIG. 10B); the step of forming the lid part 37 which is formed in the shape of a lid stacked on the frame part 35 and closing the opening of the frame part 35, and has second through hole 51 formed therein that exposes the first through hole 42 (FIG. 10C to FIG. 11A); and the step of filling the metal 157 in the insides of the first through hole 42 and second through hole 51 to form the terminal 107.

Accordingly, in the same way as the first embodiment, the step for forming the terminal 107 includes the formation of the third conductive layer 139, so the third conductive layer 139 is simply formed. Note that, the first plating foundation layer 143 can contribute to for example reinforcement of the strength of the electrode pad 13 and improvement of the bonding property between the electrode pad 13 and the conductor (second plating foundation layer 153) configuring the terminal 107. Further, when the metal 157 is deposited by plating as in the present embodiment, the first plating foundation layer 143 can function as the foundation layer to which a voltage is applied for electrolytic plating together with the second plating foundation layer 153.

Further, the method for manufacture of the second embodiment does not have a step corresponding to the deposition of the first metal 147 in the first embodiment, therefore the SAW device is formed more simply than the first embodiment.

Further, in the step of forming the third conductive layer 139, after forming the first resist layer 145 exposing the first through holes 42 and region of the predetermined pattern, the first plating foundation layer 143 is formed over the position where the first resist layer 145 is arranged and the position where it is not arranged. After that, the portion of the first plating foundation layer 143 above the first resist layer 145 and the first resist layer 145 are removed. Accordingly, compared with the case where the resist layer is formed on the plating foundation layer as in the first embodiment, removal of these layers is easy. For example, it is easy to make a etching selectivity between the conductive layer (SAW element 11 etc.) arranged on the first main surface 3a in the vibration spaces S and the layer (the first resist layer 145 in the second embodiment) on the conductive layer large.

Note that, in the second embodiment, the SAW device 101 is one example of the acoustic wave device of the first aspect of the present invention, the first plating foundation layer 143 is one example of the foundation layer of the present invention, and the method for manufacturing the SAW device 101 is one example of the method for manufacturing the acoustic wave device of the third aspect of the present invention.

Third Embodiment

Figure 12:
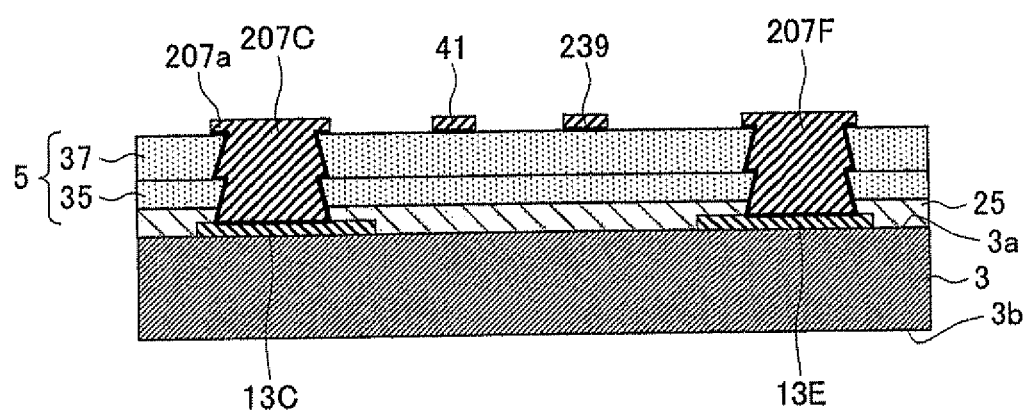
FIG. 12 A cross-sectional view corresponding to the line IVc-IVc in FIG. 3 which shows a SAW device of a third embodiment of the present invention.

FIG. 12 is a cross-sectional view corresponding to the line IVc-IVc in FIG. 3 and shows a SAW device 201 of a third embodiment of the present invention.

In the first embodiment, the inductor 41 was formed between the frame part 35 and the lid part 37. On the other hand, in the third embodiment, the inductor 41 is formed on the lid part 37. Further, the inductor 41 is included in the same conductive layer (third conductive layer 239) as a land 207a. Note that, the third embodiment and the first embodiment are substantially the same in the other configurations. Therefore, see FIG. 1 to FIG. 3.

FIG. 13 is a cross-sectional view corresponding to the cross-sectional view taken along the line IVc-IVc in FIG. 3 and explains the method for manufacturing the SAW device 201.

In the method for manufacturing the SAW device 201, first, in the same way as the first embodiment, manufacturing steps from FIG. 6A to FIG. 7A are carried out. That is, the production up to the formation of the frame part 35 is carried out in the same way as the first embodiment.

Figure 13A:
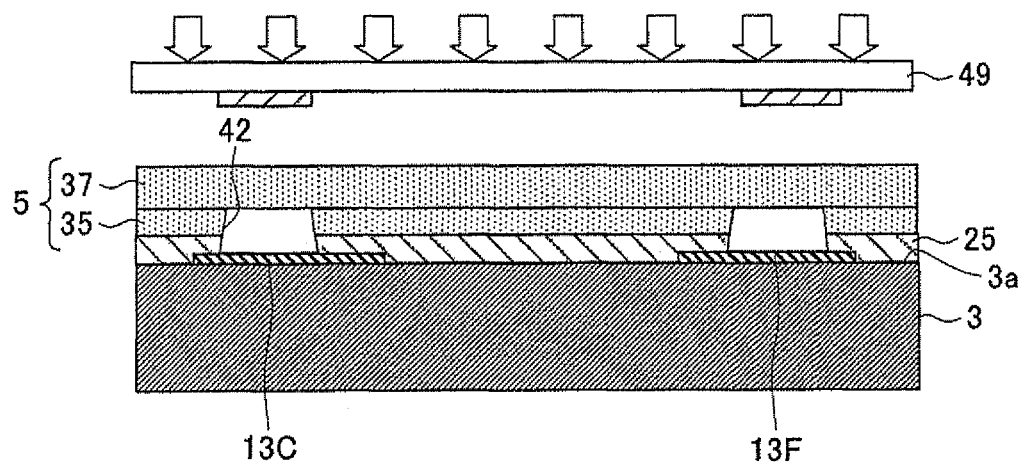
FIG. 13A to FIG. 13C are cross-sectional views corresponding to the line IVc-IVc in FIG. 3 which explain the method for manufacturing the SAW device of FIG. 12.
Figure 13B:
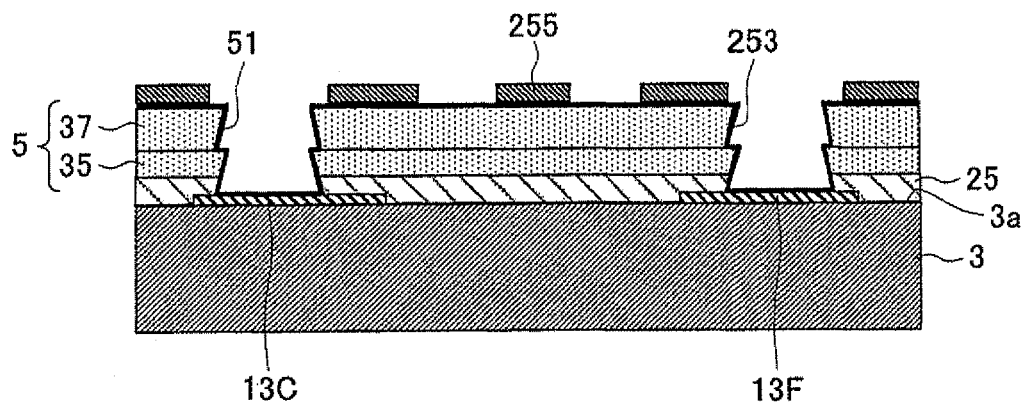

Next, as shown in FIG. 13A, a thin film which becomes the lid part 37 is formed and is patterned by photolithography. This step is the same step as that in FIG. 7D of the first embodiment.

When photolithography is carried out, as shown in FIG. 133, a portion of the thin film is removed, and the lid part 37 is formed. Accordingly, the second through holes 51 for exposing the first through holes 42 are formed on the electrode pads 13.

As shown in FIG. 133, when the lid part 37 is formed, a plating foundation layer 253 and resist layer 255 are formed.

The plating foundation layer 253 is formed over the entire surface of the layers formed on the first main surface 3a and exposed at the first main surface 3a side. That is, the plating foundation layer 253 is formed not only on the top surface of the lid part 37, but also in the insides of the first through holes 42 and second through holes 51.

The resist layer 255 is formed so that the plating foundation layer 253 is exposed in the first through holes 42 and second through holes 51 and at the region wherein the inductor 41 is formed.

Figure 13C:
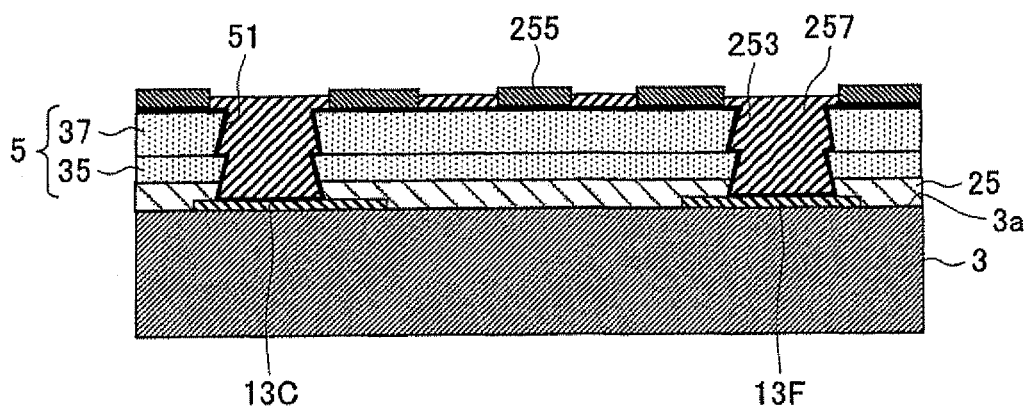

When the resist layer 255 is formed, as shown in FIG. 13C, a metal 257 is deposited in the exposed portions of the plating foundation layer 253 by plating. Then, the resist layer 255 and the portions of the plating foundation layer 253 which are covered by the resist layer 255 are removed. Accordingly, as shown in FIG. 12, terminals 207 (attached notations A to F are the same as those in the first embodiment) and the inductor 41 are formed.

Note that, after this, in the SAW device 201, a member for insulating the inductor 41 may be arranged as well. For example, a solder resist covering the inductor 41 is arranged.

According to the SAW device 201 of the third embodiment described above, in the same way as the first embodiment, the inductor 41 is arranged only in the region just above the frame part 35, therefore the same effects as those by the first embodiment are exhibited. That is, the SAW device 1 can be given multiple functions without increasing the size of the SAW device 201. Further, the inductor 41 is centrally arranged in the region of the cover 5, wherein strain and deformation hardly occur, therefore deformation of the shape of the inductor 41 becomes difficult. Accordingly, the change of electrical characteristics along with the deformation of the cover 5 is suppressed. Further, the circuit component is arranged at the position where do not overlap the SAW element 11 in the perspective plan view of the cover 5, reduction of the parasitic capacitance generated between the SAW element 11 and the inductor 41 is expected as well.

The method for manufacturing the SAW device 201 of the third embodiment has the following steps: the step of forming the SAW element 11 and the electrode pad 13 connected to the SAW element 11 on the first main surface 3a of the substrate 3 (FIG. 6A); the step of forming the frame part 35 which is stacked on the first main surface 3a, is formed in the shape of a frame surrounding the SAW element 11 in a plan view of the first main surface 3a, and has the first through hole 42 formed therein that exposes the electrode pad 13 (FIG. 6C to FIG. 7A); the step of forming the lid part 37 which is formed in the shape of a lid stacked on the frame part 35 and closing the opening of the frame part 35, and has the second through hole 51 formed therein that exposes the first through hole 42 (FIG. 13A); the step of forming the plating foundation layer 253 in the insides of the first through hole 42 and second through hole 51 and in the region of the pattern connected with the second through hole 51 at the top surface of the lid part 37 (FIG. 13B); and the step of depositing the metal on the plating foundation layer 253 by plating and forming the circuit component (inductor 41) which is arranged only in the region just above the frame part 35 and the terminals 207 (FIG. 13C).

Accordingly, in the same way as the first and second embodiments, the step for forming the terminal 207 includes the formation of the inductor 41, so the inductor 41 is simply formed. Further, after the formation of the SAW device 1, it is also possible to adjust the inductor 41 by trimming or the like.

Note that, in the third embodiment, the SAW device 201 is one example of the acoustic wave device of the first aspect of the present invention, and the method for manufacturing the SAW device 201 is one example of the method for manufacturing the acoustic wave device of the fourth aspect of the present invention.

Fourth Embodiment

Figure 14:
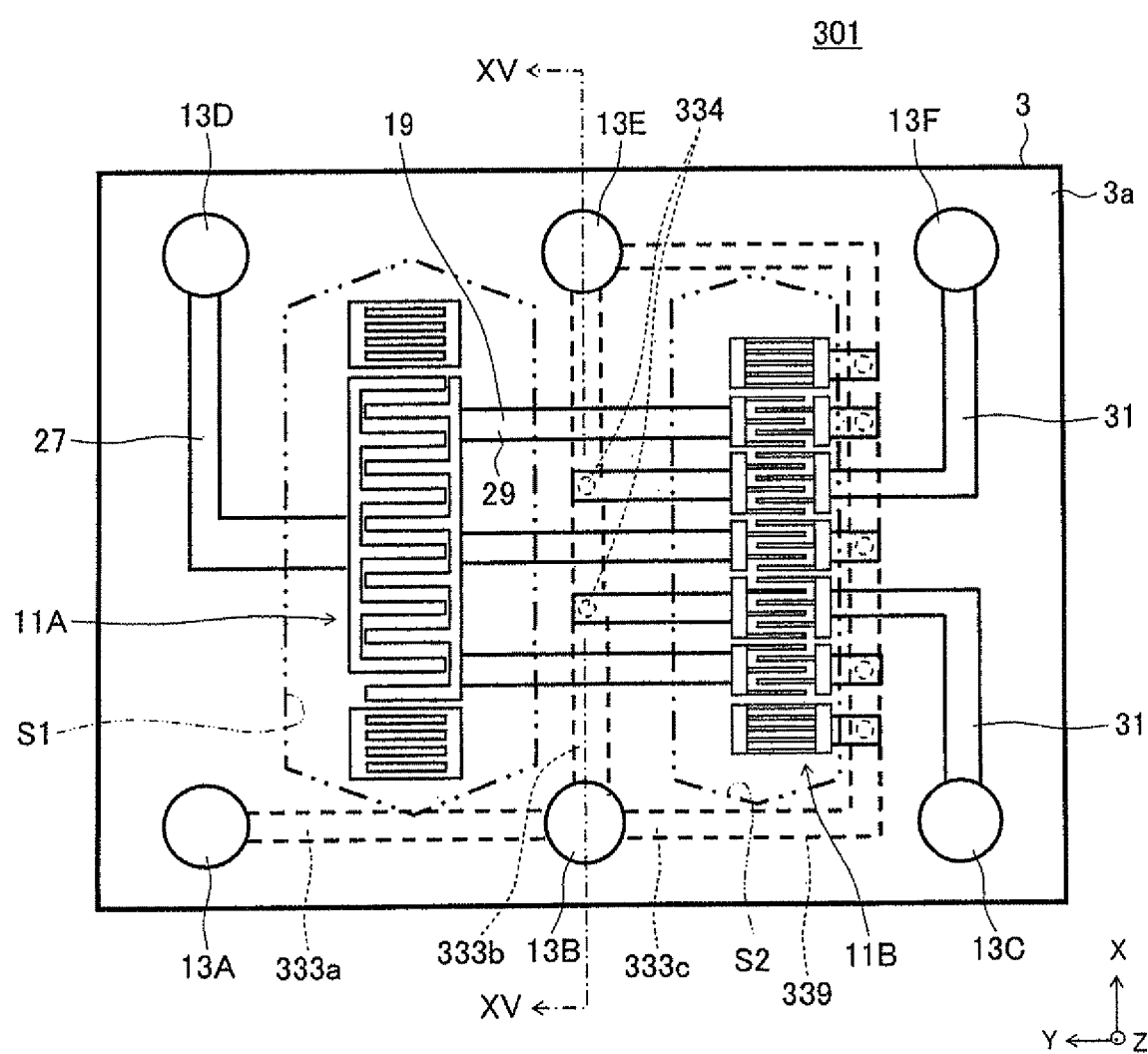
FIG. 14 A plan view showing a line structure of a SAW device of a fourth embodiment of the present invention.
Figure 15:
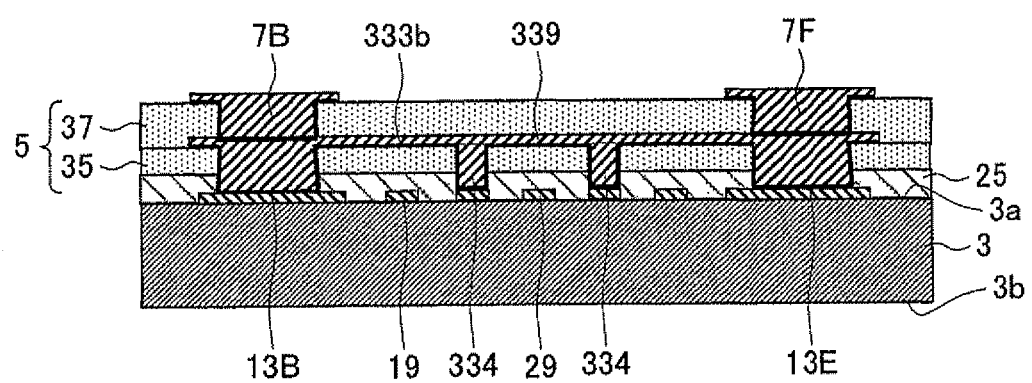
FIG. 15 A cross-sectional view taken along a line XV-XV in FIG. 14.

FIG. 14 is a plan view of a SAW device 301 according to a fourth embodiment of the present invention. Further, FIG. 15 is a cross-sectional view taken along a line XV-XV in FIG. 14. Note that, in FIG. 14, a first conductive layer 19 which is arranged on the first main surface 3a indicated by solid lines, and a third conductive layer 339 which is arranged on the frame part 35 is indicated by dotted lines.

In the first embodiment, by the first conductive layer 19, insulation layer 21, and second conductive layer 23, overhead crossing of lines given potentials which were different from each other was realized. In the fourth embodiment, an overhead crossing is realized by the first conductive layer 19, frame part 35, and third conductive layer 339. Specifically, this is as follows.

Note that, the configurations other than the overhead crossing of the SAW device 301 are substantially the same as the configurations of the SAW device 1 of the first embodiment. The inductor 41 may be arranged in the fourth embodiment, but FIG. 14 shows a case where the inductor 41 is not arranged.

The lines connecting the plurality of terminals 7 connected to the reference potential with each other are configured by the third conductive layer 339 arranged between the frame part 35 and the lid part 37. That is, a first ground connection line 333a connecting the first terminal 7A and second terminal 7E and a second ground connection line 333b and third ground connection line 333c which connect the second terminal 7B and fifth terminal 7E are configured by the third conductive layer 339.

The planar arrangement of the first ground connection line 333a, second ground connection line 333b, and third ground connection line 333c is the same as that of the first ground connection line 33a, second ground connection line 33b, and third ground connection line 33c of the first embodiment (FIG. 3). Note that, the connection of the second ground connection line 333b and third ground connection line 333c with the SAW elements 11 is made through a via conductor 334 passing through the frame part 35.

Then, as shown in FIG. 15, the second ground connection line 333b and the intermediate connection line 29 included in the first conductive layer 19 cross over each other with the frame part 35 between them. In the same way, the third ground connection line 333c and the output side connection lines 31 cross over each other with the frame part 35 between them.

The method for manufacturing the SAW device 301 is substantially the same as the method for manufacturing the SAW device 1 of the first embodiment. Note, the formation of the insulation layer 21 and second conductive layer 23 in the first embodiment (FIG. 6A) is not carried out. Further, in the formation of the third conductive layer 339 (FIG. 7B to FIG. 7C), the inductor 41 is not formed, but the first ground connection line 333a, second ground connection line 333b, and third ground connection line 333c are formed instead. The via conductor 334 is formed for example in the same way as the portion of the terminal 7 at the first main surface 3a side. In other words, the via conductor 334 is formed at the same time as the formation of the third conductive layer 339.

According to the SAW device 301 of the fourth embodiment described above, in the same way as the first embodiment, a third conductive layer 339 connected to the terminal is provided or circuit component including the first ground connection line 333a etc. are arranged only in the region just above the frame part 35, therefore the same effects as those by the first embodiment are exhibited.

Further, the SAW device 301 has the intermediate connection line 29 arranged above the first main surface 3a and the second ground connection line 333b which is included in the circuit component between the frame part 35 and the lid part 37, is given a potential different from the potential for the intermediate connection lines 29, and crosses with the intermediate connection lines 29 in the plan view of the first main surface 3a. Accordingly, the overhead crossing is realized by utilizing the cover 5, so effective utilization of the cover 5 can be made. As a result, for example, the degree of freedom of the lines can be improved and the structure can be simplified by omitting the insulation layer 21 and second conductive layer 23.

Note that, in the fourth embodiment, the SAW device 301 is one example of the acoustic wave device of the first aspect of the present invention, the intermediate connection line 29 or output side connection line 31 are one example of the second line of the present invention, and the second ground connection line 333b or third ground connection line 333c is one example of the first line of the present invention.

Fifth Embodiment

Figure 18:
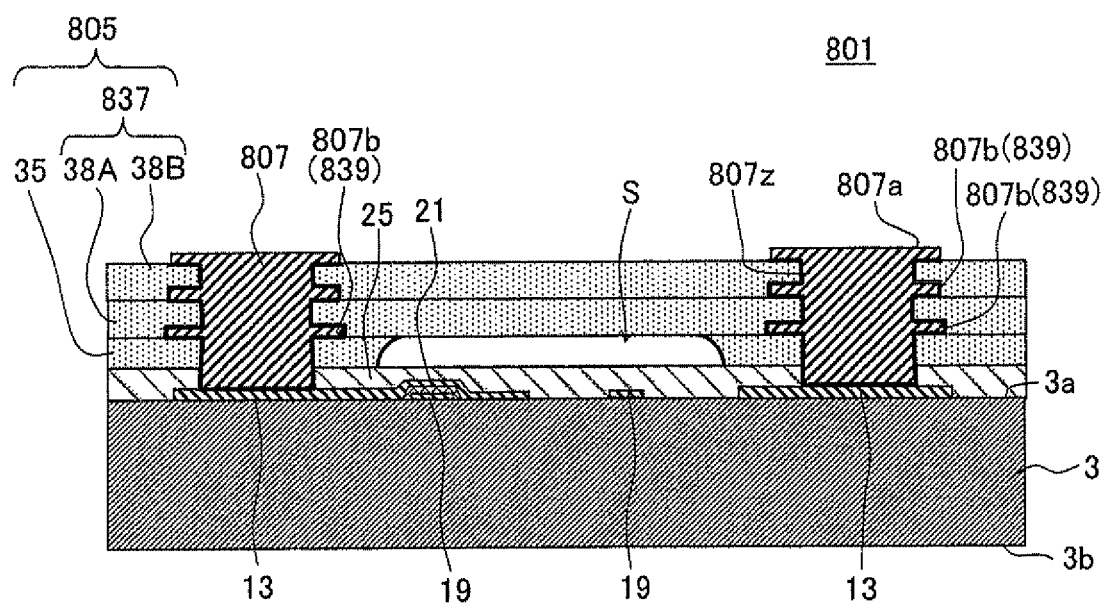

FIG. 18 is a cross-sectional view showing a SAW device 801 of a fifth embodiment.

Each terminal 807 of the SAW device 801 has a plurality of projections 807b (third conductive layer 839) in a direction in which a column part 807z stand. The number of the projections 807b in the direction where the column part 807z stand is for example two. One projection 807b is located between the frame part 35 and a lid part 837 of the cover 805 in the same way as the first embodiment. The other projection 807b is buried in the lid part 837.

Such an SAW device 801 is realized by for example stacking the lid part forming layers 38A and 388 to form the lid part 837. That is, in the method for manufacturing the first or second embodiment, the formation of the third conductive layer and the formation of the resin layer stacked on the third conductive layer may be carried out one more time.

Note that, in the fifth embodiment, the SAW device 801 is one example of the acoustic wave device of the first aspect of the present invention.

The present invention is not limited to the above embodiments and may be executed in various ways.

The acoustic wave device is not limited to a SAW device. For example, the acoustic wave device may be a film bulk acoustic resonator as well. In the acoustic wave device, the protection layer (25), insulation layer (21), and second conductive layer (23) may be omitted as well. Conversely, other suitable layers may be formed as well. On the lid part or in the lid part, over a range overlapping the vibration space, a metal layer which is not connected to the terminals may be arranged for the purpose of reinforcement of the cover.

The circuit components provided at the cover are not limited to the inductor and the lines connected to the reference potential. They may be other circuit elements or lines propagating signals as well. FIG. 16A to FIG. 16C and FIG. 17 are equivalent circuit diagrams showing other examples of the circuit components provided at the cover. Note that, in these equivalent circuit diagrams, illustration of the reflector etc. is suitably omitted.

Figure 16A:
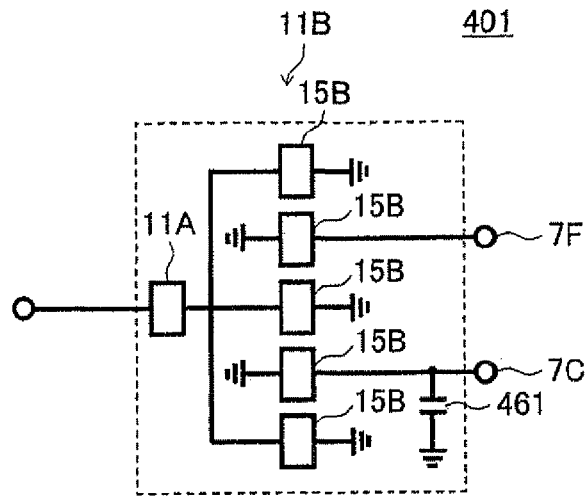
FIG. 16A to FIG. 16C are equivalent circuit diagrams showing a SAW device according to a modification of the present invention.

FIG. 16A is an equivalent circuit diagram of a SAW device 401 in which a capacitor 461 is arranged as a circuit component. The SAW device 401 has for example a balanced output SAW filter 11B in the same way as the first embodiment. The capacitor 461 is connected to one (third terminal 7C) between two output terminals of the SAW filter 11B and adjusts the degree of balance between the two output terminals.

Figure 16B:
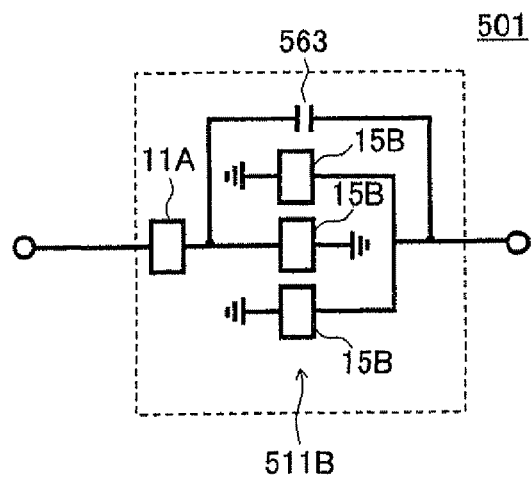

FIG. 16B is an equivalent circuit diagram of a SAW device 501 provided with a capacitor 563 having a function different from that in FIG. 16A as a circuit component. The SAW device 501 has for example a longitudinally-coupled double-mode type SAW filter 511B having three IDT electrodes 15B. The SAW filter 511B is configured by a filter having an unbalanced input and an unbalanced output. The capacitor 563 is connected to the input side and output side of the SAW filter 511B. The capacitor 563 improves the sharpness of attenuation of the signal outside the pass band in the SAW filter 511B.

Figure 16C:
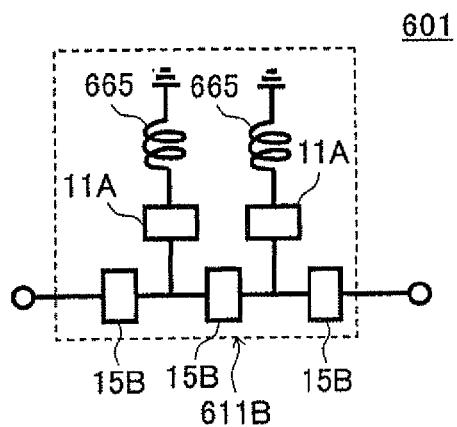

FIG. 16C is an equivalent circuit diagram of a SAW device 601 provided with inductors 665 having functions different from that of the first embodiment as a circuit component. The SAW device 601 has for example a ladder type SAW filter 611B having three IDT electrodes 15B. Further, it has two SAW resonators 11A (parallel arm resonators) connected between the IDT electrodes in the SAW filter 611B. The inductors 665 are arranged between the SAW resonators 11A and the ground and contribute to broadening of the band and to a high attenuation of the SAW filter 611B.

Figure 17:
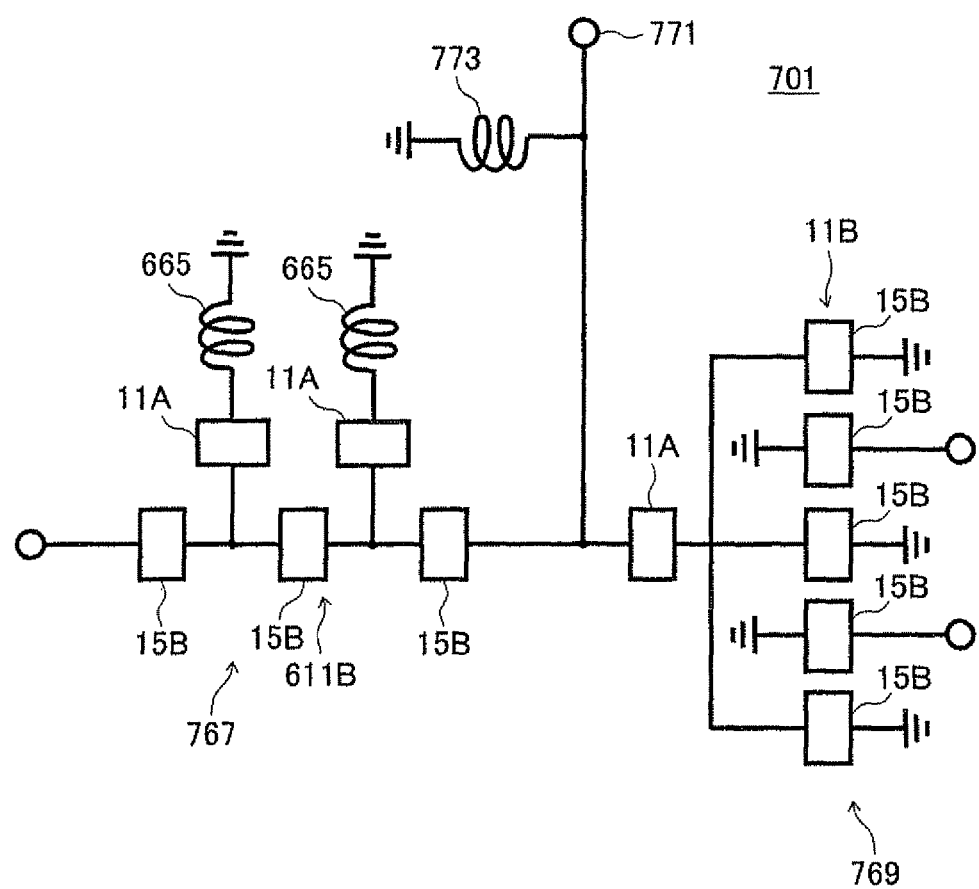
FIG. 17 An equivalent circuit diagram showing a SAW device according to another modification of the present invention, FIG. 18 A cross-sectional view showing a SAW device of a fifth embodiment of the present invention

FIG. 17 is an equivalent circuit diagram of a SAW device 701 provided with an inductor 773 having a function different from that of the first embodiment as a circuit component. The SAW device 701 is configured as a duplexer and has a transmitting filter 767, a receiving filter 769, and an antenna terminal 771 shared by these filters. The transmitting filter 767 is for example configured by a ladder-type SAW filter in the same way as the SAW device 601 of FIG. 16C. The receiving filter 769 is configured by for example a double-mode type SAW filter in the same way as the SAW device 1 of the first embodiment. The inductor 773 is connected to the antenna terminal 771 and performs impedance matching.

In the acoustic wave device of the first aspect, that is, the acoustic wave device in which the projection extending from the side surface of the terminal is covered by a cover, the projection may extend up to the region just above the vibration space as well. Further, the projection is not limited to one covered by the cover between the frame part and the lid part and may be one buried in the lid part as well.

Further, in the acoustic wave device of the first aspect, the excitation electrode may be covered by the cover without providing vibration space in the cover. In this case, elastic boundary waves are utilized as the acoustic waves.

Further, in the acoustic wave device in which circuit component is arranged only in the region just above the frame part, the circuit component is not limited to one covered by the cover and may be one arranged on the lid part as well. Further, the circuit component covered by the cover is not limited to one arranged between the frame part and the lid part and may be one buried in the lid part as well.

In the method for manufacturing the acoustic wave device of the second aspect (see the first embodiment), that is, the production method in which the step of forming the projection and the step of filling the metal in the first through hole (42) are made common use of, filling of the metal in the second through hole (51) is not limited to filling by plating. For example, the metal may be filled in the second through hole by filling a metal paste as well. In this case as well, the formation of the projection between the frame part and the lid part is carried out at the same time as the filling of the metal in the first through hole (formation of terminal).

In the method for manufacturing the acoustic wave device of the third aspect (see the second embodiment), that is, the production method in which the step of forming the projection and the step of forming the foundation layer (143) of the terminal are made common use of, the foundation layer is not limited to a foundation layer for plating. For example, the foundation layer may be arranged for the purpose of reinforcing the strength of the electrode pad (13) or improving the bonding property of the electrode pad, and the metal paste may be filled in the first through hole (42) and second through hole (51).

Further, in the method for manufacturing the acoustic wave device of the third aspect, in the same way as the first embodiment, filling of the metal in the first through hole (42) and filling of the metal in the second through hole (51) may be separately carried out as well. Further, at this time, by disposing the resist layer (155) on the foundation layer (153) and performing the plating in the same way as the first embodiment, the metal may be filled in the first through hole as well.

In the method for manufacturing the acoustic wave device of the fourth aspect (see the third embodiment), that is, the production method in which the circuit component is formed at the top surface of the lid part, filling of the metal in the first through hole (42) and filling of the metal in the second through hole (51) may be separately carried out in the same way as the first embodiment.

The shape of the terminal is not limited to a tapered shape. By a suitable shape, terminal with diameter enlarged at the main surface side compared with the opposite side in at least a portion of the direction in which the terminal stand may be realized as well. Further, the terminal may be enlarged in diameter at the side opposite to the main surface compared with the main surface side.

REFERENCE SIGNS LIST

1 . . . SAW device (acoustic wave device), 3 . . . substrate, 3a . . . first main surface (main surface), 5 . . . cover, 7 . . . terminal, 7a . . . column part (terminal), 7b . . . projection, 11A . . . SAW resonator (SAW element), 11B . . . SAW filter (SAW element), 15 . . . IDT electrode (excitation electrode), 35 . . . frame part, 37 . . . lid part, 39 . . . third conductive layer (projection), and 41 . . . inductor (circuit component).

The invention claimed is:

1. An acoustic wave device, comprising:
    a substrate configured to propagate acoustic waves;
    an excitation electrode on a main surface of the substrate;
    an electrode pad on the main surface, electrically connected to the excitation electrode;
    a terminal with a pillar-shape on the electrode pad;
    a projection with conductivity extended from a position in a side surface of the terminal, the position being apart from an upper surface and a lower surface of the terminal in its thickness direction; and
    a cover on the main surface of the substrate, which comprises a frame part on the main surface, surrounding the excitation electrode in a plan view of the main surface and a lid part on the frame part, closing an opening of the frame part to form a vibration space on the excitation electrode, and is configured to cover the side surface of the terminal and the projection.

2. The acoustic wave device according to claim 1, wherein the projection is connected to the side surface of the terminal over the entire periphery thereof.

3. The acoustic wave device according to claim 1, wherein the terminal comprises a pillar part with a taper shape, the taper shape being that a side of the main surface of the substrate is larger in diameter than a side opposite to the main surface of the substrate.

4. The acoustic wave device according to claim 1, wherein the terminal and the projection are formed of the same material.

5. The acoustic wave device according to claim 1, wherein the projection has a layer-shape.

6. An acoustic wave device according to claim 1, wherein the cover covers the projection from both sides of an upper side and a lower side.

7. An acoustic wave device according to claim 1, wherein the position from which the projection extends is apart from the main surface of the substrate, and wherein an upper side of the projection is covered by the cover.

8. An acoustic wave device, comprising:
a substrate configured to propagate acoustic waves;
an excitation electrode on a main surface of the substrate;
an electrode pad on the main surface, electrically connected to the excitation electrode;
a terminal with a pillar-shape on the electrode pad;
a projection with conductivity extended from a position in a side surface of the terminal, the position being apart from an upper surface and a lower surface of the terminal in its thickness direction; and
a cover on the main surface of the substrate, which is configured to cover the side surface of the terminal and the projection and to protect the excitation electrode,
wherein the projection comprises a circuit component including at least one of a first line and a circuit element.

9. The acoustic wave device according to claim 8, wherein the cover comprises a frame part on the main surface surrounding the excitation electrode in a plan view of the main surface, and
a lid part on the frame part closing an opening of the frame part, and
the circuit component is located only directly above the frame part.

10. The acoustic wave device according to claim 9, wherein the projection is between the frame part and the lid part.

11. The acoustic wave device according to claim 9, wherein the frame part and the lid part are formed of the same material.

12. The acoustic wave device according to claim 8, further comprising:
a second line which is on the main surface and is not electrically connected to the first line,
wherein the first line and the second line cross each other with an insulation layer interposed therebetween.

13. The acoustic wave device according to claim 8, further comprising:
a second line which is on the main surface and is not electrically connected to the first line,
wherein the first line and the second line cross each other with the frame part interposed therebetween.

14. The acoustic wave device according to claim 8, wherein the circuit component comprises the circuit element, and the circuit element comprises a meander type inductor.

15. An acoustic wave device according to claim 8, wherein the cover covers the projection from both sides of an upper side and a lower side.

16. An acoustic wave device according to claim 8, wherein the position from which the projection extends is apart from the main surface of the substrate, and wherein an upper side of the projection is covered by the cover.

* * * * *